(12) United States Patent
Masada et al.

(10) Patent No.: US 11,254,029 B2
(45) Date of Patent: Feb. 22, 2022

(54) WAFER DIVIDING APPARATUS

(71) Applicant: DISCO CORPORATION, Tokyo (JP)

(72) Inventors: Takayuki Masada, Tokyo (JP); Yoshihiro Kawaguchi, Tokyo (JP); Tomohito Matsuda, Tokyo (JP); Yuhei Fujii, Tokyo (JP); Susumu Inakazu, Tokyo (JP); Ryota Saito, Tokyo (JP); Naoya Takesue, Tokyo (JP); Hideaki Ishida, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 231 days.

(21) Appl. No.: 16/701,884

(22) Filed: Dec. 3, 2019

(65) Prior Publication Data

US 2020/0171707 A1 Jun. 4, 2020

(30) Foreign Application Priority Data

Dec. 4, 2018 (JP) .............................. JP2018-227203

(51) Int. Cl.
*B28D 5/00* (2006.01)
*H01L 21/683* (2006.01)
*H01L 21/67* (2006.01)

(52) U.S. Cl.
CPC .......... *B28D 5/0076* (2013.01); *B28D 5/0011* (2013.01); *B28D 5/0082* (2013.01); *H01L 21/67092* (2013.01); *H01L 21/6836* (2013.01)

(58) Field of Classification Search
CPC .. B28D 5/0076; B28D 5/0011; B28D 5/0082; H01L 21/67092; H01L 21/6836
USPC .......................................................... 225/96
See application file for complete search history.

(56) References Cited

U.S. PATENT DOCUMENTS

| 5,950,643 | A | * | 9/1999 | Miyazaki | .......... | H01L 21/67207 |
| | | | | | | 134/25.4 |
| 6,345,616 | B1 | * | 2/2002 | Umahashi | ............ | B28D 5/0076 |
| | | | | | | 125/13.01 |
| 6,358,115 | B1 | * | 3/2002 | Koike | .................. | B23D 59/001 |
| | | | | | | 451/5 |
| 6,494,197 | B1 | * | 12/2002 | Yoshimura | ........... | B28D 5/0076 |
| | | | | | | 125/12 |
| 9,748,182 | B2 | * | 8/2017 | Nakamura | ........ | H01L 21/67132 |
| 10,758,998 | B2 | * | 9/2020 | Yamada | ............... | B23K 26/364 |
| 2017/0365519 | A1 | * | 12/2017 | Priewasser | ......... | B23K 26/0622 |

(Continued)

FOREIGN PATENT DOCUMENTS

JP 2002192370 A 7/2002

*Primary Examiner* — Omar Flores Sanchez
(74) *Attorney, Agent, or Firm* — Greer, Burns & Crain, Ltd.

(57) ABSTRACT

A wafer dividing apparatus for dividing a wafer stuck to an adhesive tape and supported at an opening of a frame into individual chips along a scheduled division line is provided. The wafer dividing apparatus includes a cassette table movable upwardly and downwardly in a Z axis direction, a first carry-out/in unit that carries out the frame from the cassette placed on the cassette table or carry in the frame to the cassette, a first temporary receiving unit including a pair of first guide rails extending in the X axis direction and a guide rail opening/closing portion that increases the distance between the pair of first guide rails, a reversing unit including a holding portion that holds the frame and rotates by 180 degrees to reverse the front and back of the frame, and a transport unit that moves the reversed frame.

8 Claims, 13 Drawing Sheets

(56) References Cited

U.S. PATENT DOCUMENTS

| | | | |
|---|---|---|---|
| 2018/0166282 A1* | 6/2018 | Tabuchi | H01L 21/67092 |
| 2019/0109023 A1* | 4/2019 | Mihai | H01L 21/67132 |
| 2019/0160597 A1* | 5/2019 | Chi | B81C 1/00904 |
| 2021/0233814 A1* | 7/2021 | Nomaru | B28D 5/0005 |

* cited by examiner

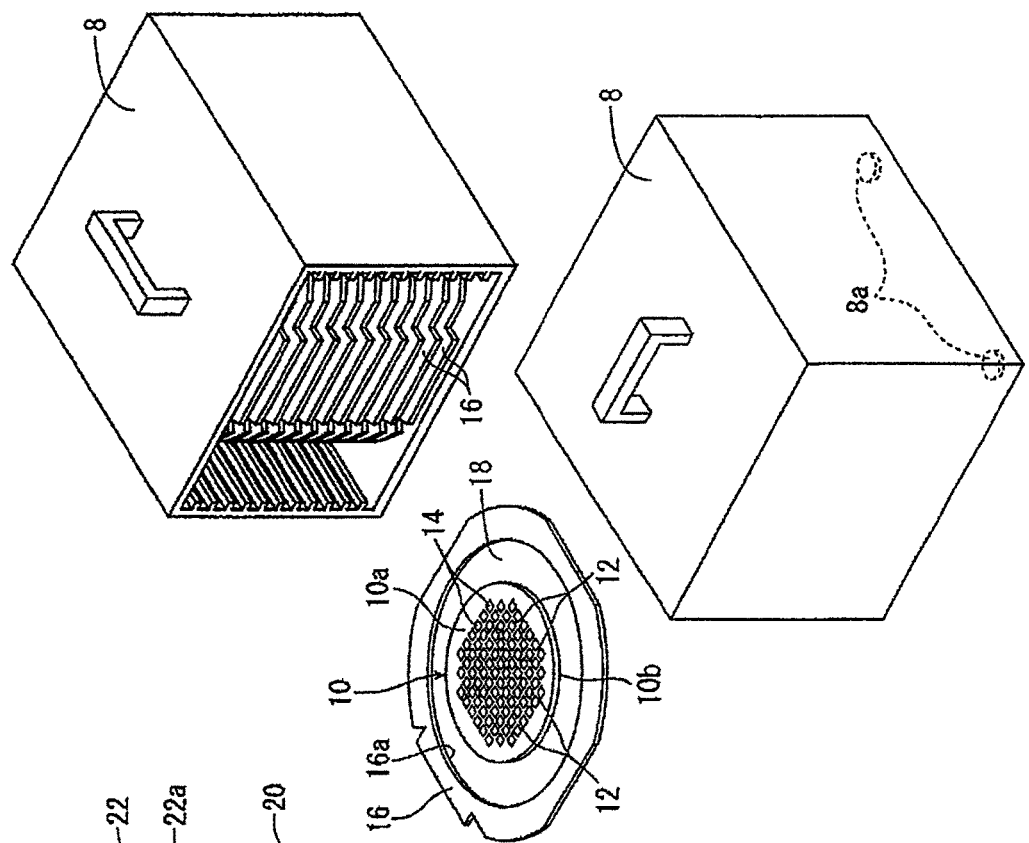
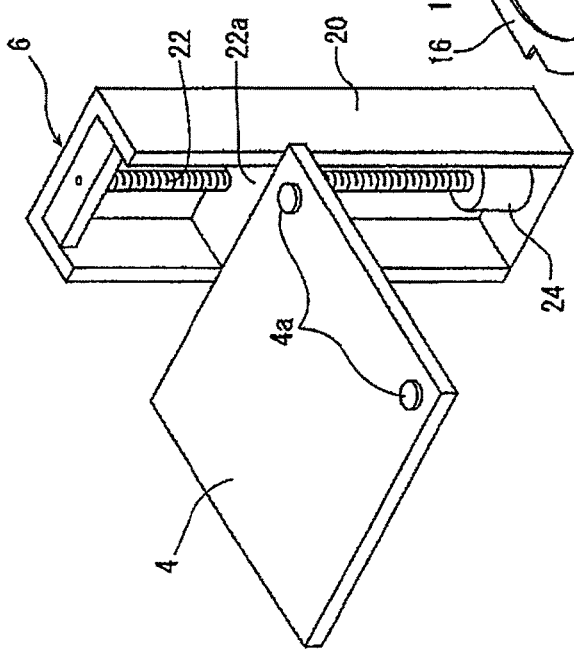

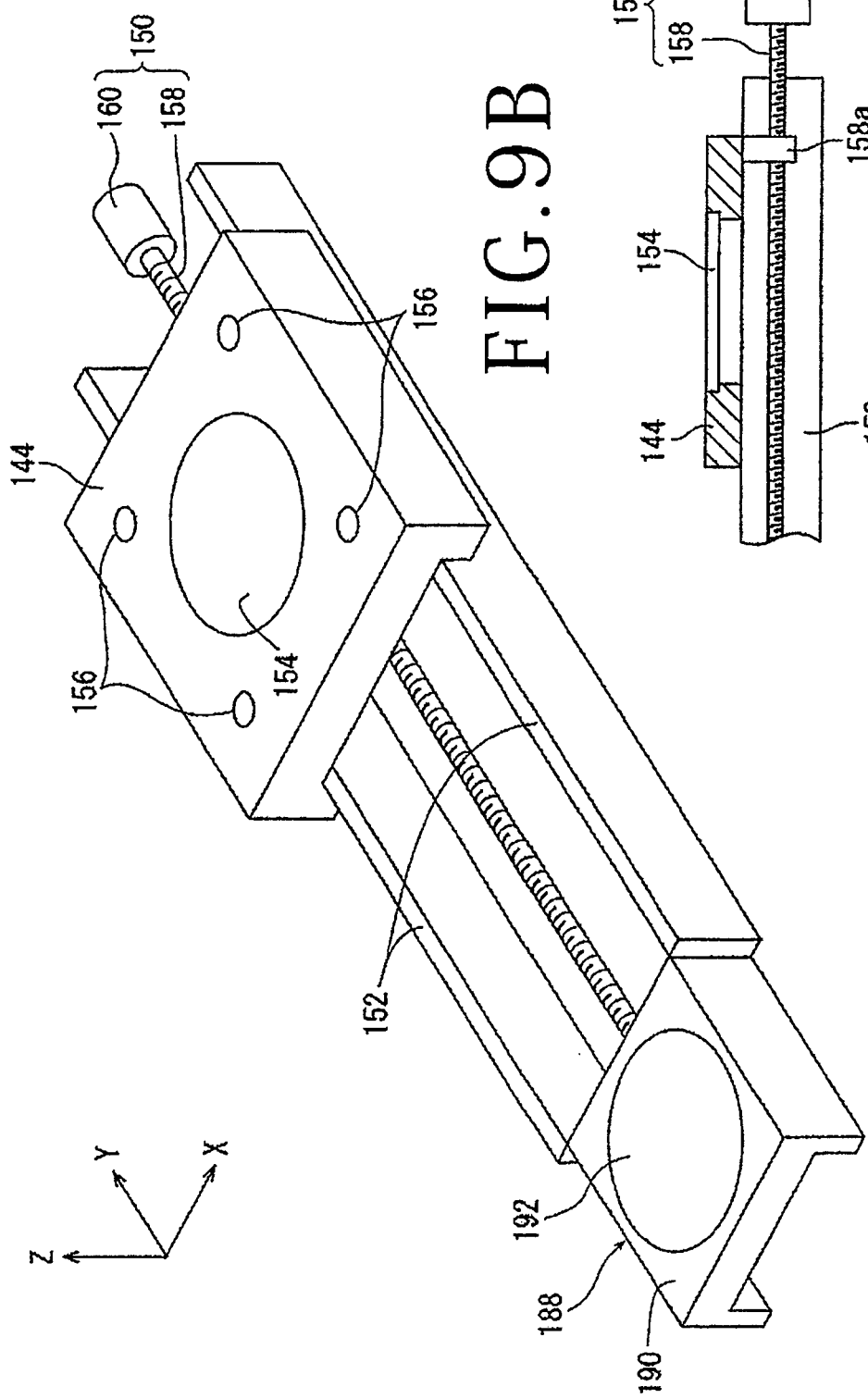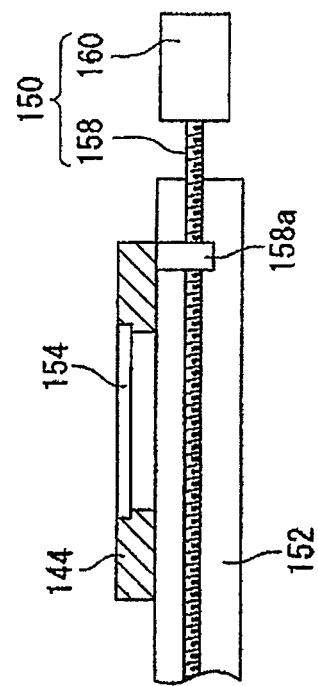

WAFER DIVIDING APPARATUS

BACKGROUND OF THE INVENTION

Field of the Invention

The present invention relates to a wafer dividing apparatus that divides a wafer stuck to an adhesive tape and supported at an opening of a frame along scheduled division lines into individual chips.

Description of the Related Art

A wafer having a plurality of devices such as integrated circuits (ICs) or large scale integrations (LSIs) formed thereon and partitioned by scheduled division lines (for example, a silicon (Si) wafer) is divided into individual device chips by a dicing apparatus or a laser processing apparatus, and each divided device chip is utilized in electric equipment such as a mobile phone or a personal computer.

In the laser processing apparatus, a focusing point of a laser beam of a transmissive wavelength to a wafer is positioned to the inside of the wafer corresponding to a scheduled division line and the laser beam irradiated upon the wafer to form a modified layer along the scheduled division line, and then external force is applied to the wafer to divide the wafer into individual device chips (refer, for example, to Japanese Patent No. 3408805).

SUMMARY OF THE INVENTION

However, the laser processing apparatus has a problem that, when a wafer is divided into individual device chips, dust of the wafer in which a modified layer is provided scatters and adheres to the surface of the device chips and thereby degrades the quality of the device chips.

A problem similar to that described above occurs also when a modified layer is formed in the inside, corresponding to a scheduled division line, of a wafer formed from glass, sapphire or the like and divided into individual chips.

Therefore, it is an object of the present invention to provide a wafer dividing apparatus that can prevent dust, which scatters when a wafer is divided into individual chips, from adhering to the surface of the chips and can thereby prevent degradation of the quality of the chips.

In accordance with an aspect of the present invention, there is provided a wafer dividing apparatus for dividing a wafer stuck to an adhesive tape and supported at an opening of a frame into individual chips along a scheduled division line. The wafer dividing apparatus includes a cassette table on which a cassette that accommodates a plurality of wafers each stuck to an adhesive tape and supported at an opening of a frame is placed and which is movable upwardly and downwardly in a Z axis direction, a first carry-out/in unit configured to grasp the frame and move the frame in an X axis direction orthogonal to the Z axis direction to carry out the frame from the cassette placed on the cassette table or carry in the frame to the cassette, a first temporary receiving unit including a pair of first guide rails that extend in the X axis direction and configured to support the frame carried in by the first carry-out/in unit and a guide rail opening/closing portion configured to increase a distance between the pair of first guide rails in a Y axis direction orthogonal to the Z axis direction and the X axis direction so as to permit passage of the frame in the Z axis direction, a reversing unit including a holding portion configured to hold the frame supported on the first temporary receiving unit and configured to rotate by 180 degrees by a rotatable shaft extending in the X axis direction to reverse front and back of the frame, a transport unit configured to move the reversed frame in the Y axis direction, a second temporary receiving unit including a pair of second guide rails extending in the X axis direction and configured to support the frame moved in the Y axis direction, a second carry-out/in unit configured to move the frame supported on the second temporary receiving unit in the X axis direction, a third temporary receiving unit disposed on one side in the X axis direction of the second temporary receiving unit and including a pair of third guide rails extending in the X axis direction and configured to support the frame received by the second carry-out/in unit and a guide rail operation portion configured to expand a distance between the pair of third guide rails in the Y axis direction so as to permit passage of the frame in the Z axis direction, a frame lifting unit disposed at a lower location in the Z axis direction of the third temporary receiving unit and configured to support and move the frame supported on the third temporary receiving unit upwardly or downwardly in the Z axis direction, a dividing unit disposed at an upper location in the Z axis direction of the third temporary receiving unit and including a cylindrical portion configured to be brought into contact, when the frame supported on the frame lifting unit is moved up, with the adhesive tape located between the frame and the wafer to expand the adhesive tape thereby to divide the wafer into the individual chips along the scheduled division line, a suction table disposed in an inside of the cylindrical portion and configured to suck and hold the wafer divided into the chips to maintain a distance between the chips, and a tape contraction unit disposed on the frame lifting unit side and configured to heat and contract the slackened adhesive tape. The transport unit transports the frame, which has been carried out from the third temporary receiving unit to the second temporary receiving unit by the second carry-out/in unit and in which the adhesive tape is in an contracted state, to the first temporary receiving unit.

Preferably, the wafer dividing apparatus further includes a cleaning unit disposed on an opposite side to the cassette table across the first temporary receiving unit and configured to clean the wafer supported on the frame, and a third carry-out/in unit configured to carry in the frame transported to the first temporary receiving unit to the cleaning unit or carry out the frame from the cleaning unit.

Further preferably, the wafer dividing apparatus further includes a transparent table disposed just below the first temporary receiving unit and including a transparent plate of a size corresponding to a size of the wafer, a lifting unit configured to move the reversing unit between the transparent table and the first temporary receiving unit, a table moving unit configured to move the transparent table, on which the frame whose front and back are reversed by the reversing unit and the wafer is in an upwardly directed state, from just below the first temporary receiving unit in a direction toward the second temporary receiving unit, a chamber disposed below the second temporary receiving unit and configured to cover the wafer supported on the frame placed on the transparent table moved by the table moving unit, inert gas being supplied into the chamber, and an ultraviolet (UV) irradiation unit disposed below the chamber and configured to irradiate ultraviolet rays upon the adhesive tape stuck to the frame. The reversing unit is disposed at an upper location of the transparent table and includes a holding portion configured to hold the frame, which is to be carried out to the first temporary receiving unit by the third carry-out/in unit and supports the cleaned wafer, the reversing unit being operable to rotate by 180 degrees to reverse the front and back of the frame and place the frame on the transparent table.

Further preferably, the reversing unit includes a first reversing unit including a holding portion configured to hold the frame supported on the first temporary receiving unit and configured to rotate by 180 degrees by a rotatable shaft extending in the X axis direction to reverse the front and back of the frame, and a second reversing unit disposed at an upper location of the transparent table and including a holding portion configured to hold the frame, which is carried out to the first temporary receiving unit by the third carry-out/in unit and supports the cleaned wafer, the second reversing unit being operable to rotate by 180 degrees to reverse the front and back of the frame and place the frame on the transparent table.

Further preferably, the transport unit includes a first transport unit configured to move the frame reversed by the first reversing unit in the Y axis direction, and a second transport unit configured to transport the frame, which has been carried out from the third temporary receiving unit to the second temporary receiving unit by the second carry-out/in unit and in which the adhesive tape is in the contracted state, to the first temporary receiving unit.

Preferably, the wafer dividing apparatus is configured such that the holding portion of the second reversing unit includes a first holding portion and a second holding portion, and that, when ultraviolet rays are irradiated upon the adhesive tape by the UV irradiation unit and the transparent table on which the frame in which the wafer is in an upwardly directed state is placed is positioned just below the first temporary receiving unit by the table moving unit, the second reversing unit holds the frame placed on the transparent table with the first holding portion and holds a next frame that supports a cleaned wafer supported on the first temporary receiving unit with the second holding portion, and rotates by 180 degrees to allow the frame held by the first holding portion to be held by the first reversing unit and place the next frame held by the second holding portion on the transparent table, the first reversing unit rotates by 180 degrees by the rotatable shaft extending in the X axis direction to cause the frame held thereby to be supported by the first temporary receiving unit, and the first carry-out/in unit carries out the frame supported on the first temporary receiving unit to the cassette.

Preferably, the wafer dividing apparatus is configured such that the pair of third guide rails of the third temporary receiving unit include an upper stage guide rail portion at an upper location in the Z axis direction and a lower stage guide rail portion at a lower location in the Z axis direction, that the frame on which a wafer positioned to the second temporary receiving unit before divided into chips is supported is carried in from the second temporary receiving unit to the upper stage guide rail portion of the third temporary receiving unit by the second carry-out/in unit, that the frame on which the wafer divided into chips is supported is supported on the lower stage guide rail portion after the frame supported on the upper stage guide rail portion is moved up by the frame lifting unit and the wafer is divided into chips by the dividing unit, that the frame that is positioned to the second temporary receiving unit and on which a next wafer before divided into chips is carried in from the second temporary receiving unit to the upper stage guide rail portion of the third temporary receiving unit by the second carry-out/in unit, and that the frame that is supported on the lower stage guide rail portion and supports the wafer divided into chips is carried out to the second temporary receiving unit by the second carry-out/in unit.

Preferably, the wafer dividing apparatus includes two sets of the second carry-out/in units of mirror structures, two sets of the third temporary receiving units of mirror structures, two sets of the frame lifting units of mirror structures, two sets of the dividing units of mirror structures, two sets of the suction tables of mirror structures, and two sets of the tape contraction units of mirror structures.

With the wafer dividing apparatus according to the present invention, since external force is applied to a wafer stuck to an adhesive tape in a state in which the wafer is directed downwardly to divide the wafer into individual chips, dust, which scatters when the wafer is divided into individual chips, does not stick to the surface of the chips, and degradation of the quality of the chips can be prevented.

The above and other objects, features and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIG. 2A is a perspective view of a cassette table depicted in FIG. 1;

FIGS. 2B and 2C are perspective views of a cassette to be placed on the cassette table;

FIG. 9A is a perspective view of a transparent table, a table moving unit, and a UV irradiation unit depicted in FIG. 1;

FIG. 9B is a sectional view of the transparent table and the table moving unit;

DETAILED DESCRIPTION OF THE PREFERRED EMBODIMENT

In the following, an embodiment of the wafer dividing apparatus according to the present invention is described with reference to the drawings.

Figure 1:
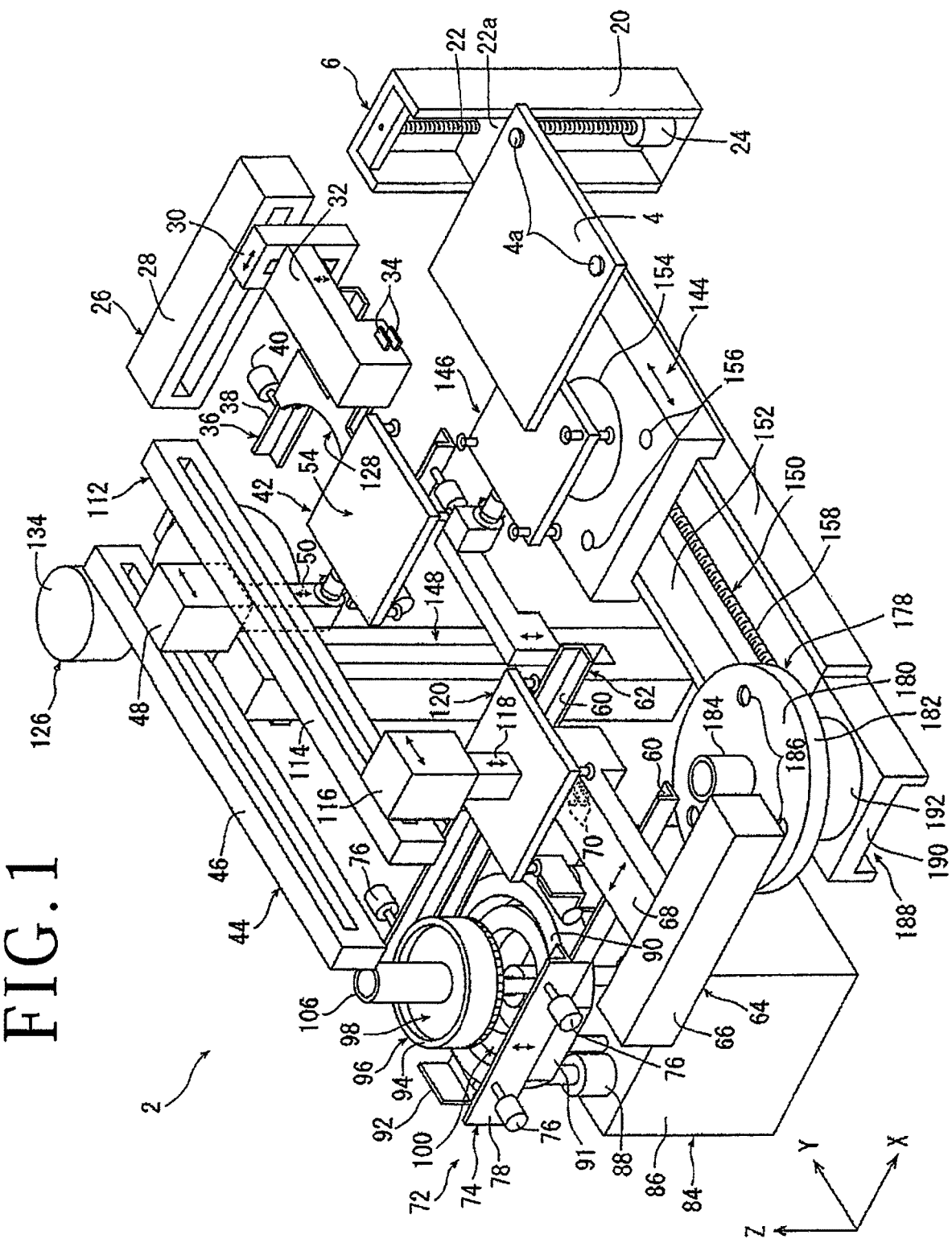
FIG. 1 is a perspective view of a wafer dividing apparatus.

As depicted in FIG. 1, a wafer dividing apparatus generally denoted by reference numeral 2 includes a cassette table 4 movable upwardly and downwardly in a Z axis direction indicated by an arrow mark Z in FIG. 1, and a cassette table lifting unit 6 for moving the cassette table 4 upwardly and downwardly in the Z axis direction. It is to be noted that an X axis direction indicated by an arrow mark X in FIG. 1 is a direction orthogonal to the Z axis direction, and a Y axis direction indicated by an arrow mark Y in FIG. 1 is a direction orthogonal to the X axis direction and the Z axis direction. Further, a plane defined by the X axis direction and the Y axis direction is substantially horizontal.

Referring to FIG. 2A together with FIG. 1, the cassette table 4 in the embodiment depicted has a rectangular shape, and a pair of engaging projections 4a are formed on an upper face of the cassette table 4. As depicted in FIGS. 2B and 2C, a cassette 8 to be placed on the cassette table 4 is configured to accommodate a plurality of wafers 10 with a space left therebetween in the upward and downward direction. A pair of engaging recesses 8a corresponding to the pair of engaging projections 4a of the cassette table 4 are formed on a lower face of the cassette 8 such that, when the cassette 8 is placed on the upper face of the cassette table 4, the engaging projections 4a of the cassette table 4 are engaged with the engaging recesses 8a of the cassette 8 to prevent positional displacement of the cassette 8 with respect to the cassette table 4.

As depicted in FIGS. 2B and 2C, a plurality of wafers 10 that are to be divided by a wafer dividing apparatus 2 are accommodated in the cassette 8. A front face 10a of each wafer 10 having a disk shape is partitioned into a plurality of rectangular regions by lattice-like scheduled division lines 12, and a device 14 is formed in each of the plurality of rectangular regions. The wafer 10 is stuck on a back face 10b side thereof to an adhesive tape 18 fixed to an annular frame 16 and is supported at an opening 16a of the frame 16 through the adhesive tape 18. Further, a modified layer (not depicted) as a division start point at which the strength is reduced by irradiating a laser beam of a transmissive wavelength to the wafer 10 upon the wafer 10 using a laser processing apparatus (not depicted) while a focusing point of the laser beam is positioned to the inside corresponding to a scheduled division line 12 is formed along the scheduled division line 12.

Continuing description with reference to FIG. 2A, the cassette table lifting unit 6 includes a housing 20 extending in the Z axis direction, a ball screw 22 disposed in the housing 20 and extending in the Z axis direction, and a motor 24 connected to a lower end portion of the ball screw 22. A nut portion 22a of the ball screw 22 is fixed to the cassette table 4. Thus, the cassette table lifting unit 6 is configured such that rotational motion of the motor 24 is converted into linear motion by the ball screw 22 and transmitted to the cassette table 4 to move the cassette table 4 upwardly or downwardly in the Z axis direction.

As depicted in FIG. 1, a first carry-out/in unit 26 is disposed adjacent the cassette table 4 such that it grasps a frame 16 from a cassette 8 placed on the cassette table 4 and carries in and out the frame 16 in the X axis direction orthogonal to the Z axis direction. In short, by grasping and moving the frame 16 in the X axis direction, the first carry-out/in unit 26 can carry out a frame 16 from the cassette 8 placed on the cassette table 4 or carry in the frame 16 to the cassette 8.

The first carry-out/in unit 26 includes a housing 28 fixed through a suitable bracket (not depicted) and extending in the X axis direction, an X axis movable member 30 supported for movement in the X axis direction on the housing 28, and an X axis feeding unit (not depicted) for moving the X axis movable member 30 in the X axis direction. It is sufficient if the X axis feeding unit is configured such that it includes a ball screw connected to the X axis movable member 30 and extending in the X axis direction, and a motor for rotating the ball screw. Further, on the X axis movable member 30, a Z axis movable member 32 is supported for movement in the Z axis direction and a Z axis feeding unit (not depicted) for moving the Z axis movable member 32 in the Z axis direction are provided. It is sufficient if the Z axis feeding unit is configured such that it includes a ball screw connected to the Z axis movable member 32 and extending in the Z axis direction, and a motor for rotating the ball screw.

Description of the first carry-out/in unit 26 is continued with reference to FIG. 1. The Z axis movable member 32 extends in the Y axis direction from a base end thereof connected to the X axis movable member 30, and a pair of grasping pieces 34 of the air driven type are mounted in a spaced relationship from each other in the Z axis direction on a one-side end face in the X axis direction (end face on this side in FIG. 1) on a free end side of the Z axis movable member 32. The pair of grasping pieces 34 are positioned so as to be opposed to a cassette 8 placed on the cassette table 4. Further, the pair of grasping pieces 34 are configured such that the distance therebetween can be expanded and contracted.

Further, the first carry-out/in unit 26 is configured such that, by reducing the distance between the pair of grasping pieces 34 after the X axis movable member 30 is moved by the X axis feeding unit and the Z axis movable member 32 is moved by the Z axis feeding unit to adjust the X axis direction position and the Z axis direction position of the pair of grasping pieces 34, the frame 16 in a cassette 8 placed on the cassette table 4 is grasped by the pair of grasping pieces 34. Further, the first carry-out/in unit 26 is configured such that, by rendering the X axis feeding unit operative, the frame 16 grasped by the pair of grasping pieces 34 is moved in the X axis direction thereby to carry in the frame 16 to a first temporary receiving unit 36 hereinafter described from the cassette 8 and carry out the frame 16 from the first temporary receiving unit 36 into the cassette 8.

Figure 3:
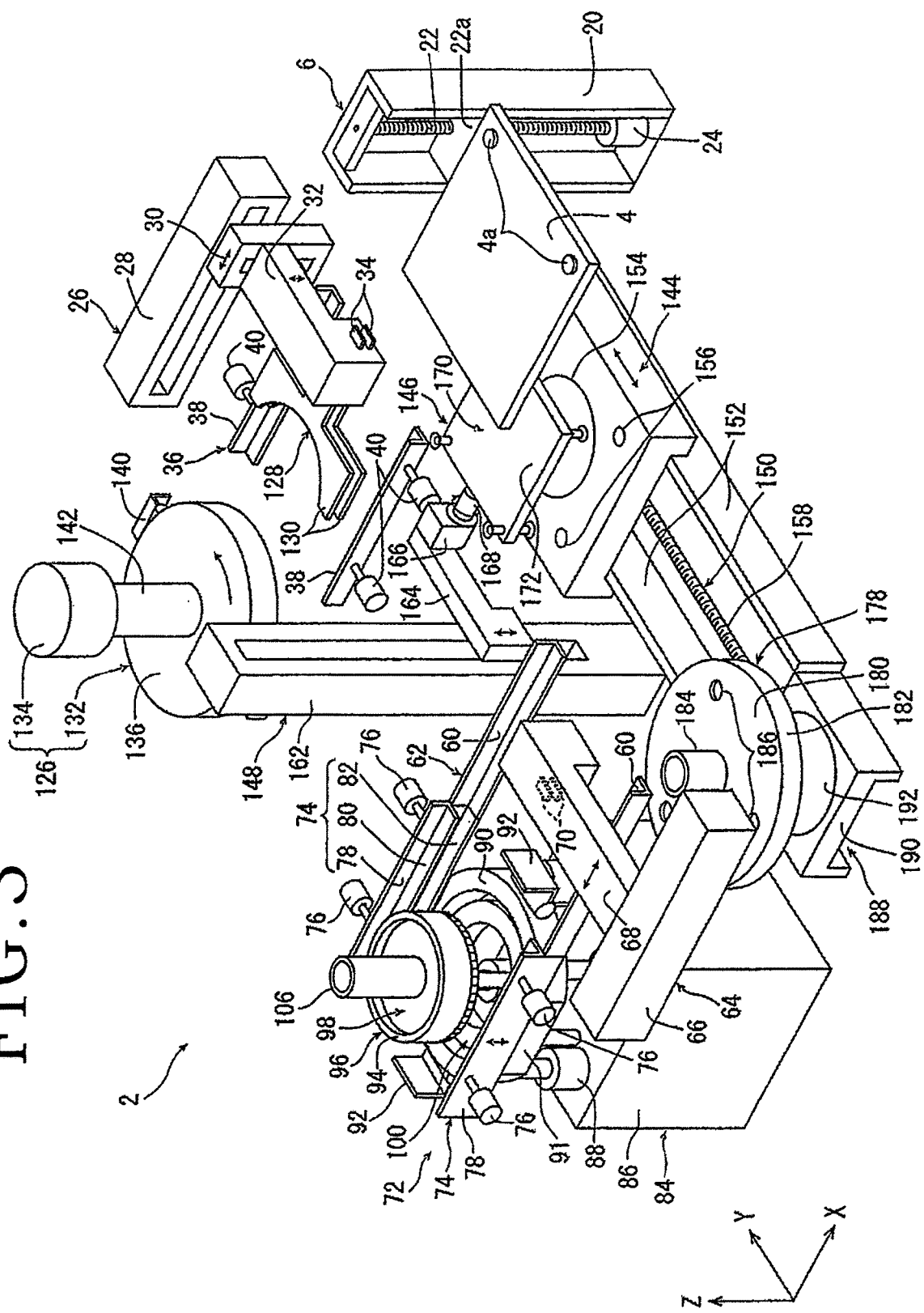
FIG. 3 is a partial perspective view of the wafer dividing apparatus in which a first reversing unit, a first transport unit, and a second transport unit are omitted from the wafer dividing apparatus depicted in FIG. 1.

As depicted in FIG. 3, the first temporary receiving unit 36 is disposed on one side in the X axis direction of the cassette table 4. The first temporary receiving unit 36 includes a pair of first guide rails 38 that extends in the X axis direction and supports the frame 16 carried in by the first carry-out/in unit 26, and a guide rail opening/closing portion 40 that expands the distance between the pair of first guide rails 38 in the Y axis direction orthogonal to the Z direction and the X axis direction to allow the frame 16 to pass in the Z axis direction. In short, the distance between the pair of first guide rails 38 can be increased so as to permit passage of the frame 16 in the Z axis direction by the guide rail opening/closing portion 40.

Description of the first temporary receiving unit 36 is continued with reference to FIG. 3. The pair of first guide rails 38 are formed so as to have an L-shaped cross section and are disposed in a spaced relationship from each other in the Y axis direction. It is sufficient if the guide rail opening/closing portion 40 is a plurality of air cylinders or electric cylinders connected to the pair of first guide rails 38, and changes the distance in the Y axis direction between the pair of first guide rails 38 between a supporting position at which the frame 16 can be supported by the pair of first guide rails 38 and a permission position at which the distance between the pair of first guide rails 38 is greater than that at the supporting position such that passage of the frame 16 in the Z axis direction is permitted. It is to be noted that the pair of first guide rails 38 are supported for movement in the Y axis direction through a suitable bracket (not depicted).

As depicted in FIG. 1, the wafer dividing apparatus 2 includes a first reversing unit 42 that includes a holding portion for holding the frame 16 supported on the first temporary receiving unit 36 and is rotated by 180 degrees by a rotary shaft extending in the X axis direction to reverse the front and back of the frame 16, and a first transport unit 44 that moves the first reversing unit 42 in the Y axis direction.

The first transport unit 44 is described with reference to FIG. 4. The first transport unit 44 includes a housing 46 fixed through a suitable bracket (not depicted) and extending in the Y axis direction, a Y axis movable member 48 supported for movement in the Y axis direction on the housing 46, a Y axis feeding unit (not depicted) for moving the Y axis movable member 48 in the Y axis direction, a Z axis movable member 50 supported for movement in the Z axis direction on the Y axis movable member 48, and a Z axis feeding unit (not depicted) that moves the Z axis movable member 50 in the Z axis direction. It is sufficient if the Y axis feeding unit is configured from a ball screw connected to the Y axis movable member 48 and extending in the Y axis direction, and a motor for rotating the ball screw, and it is sufficient if the Z axis feeding unit is configured from a ball screw connected to the Z axis movable member 50 and extending in the Z axis direction, and a motor for rotating this ball screw.

Figure 4:
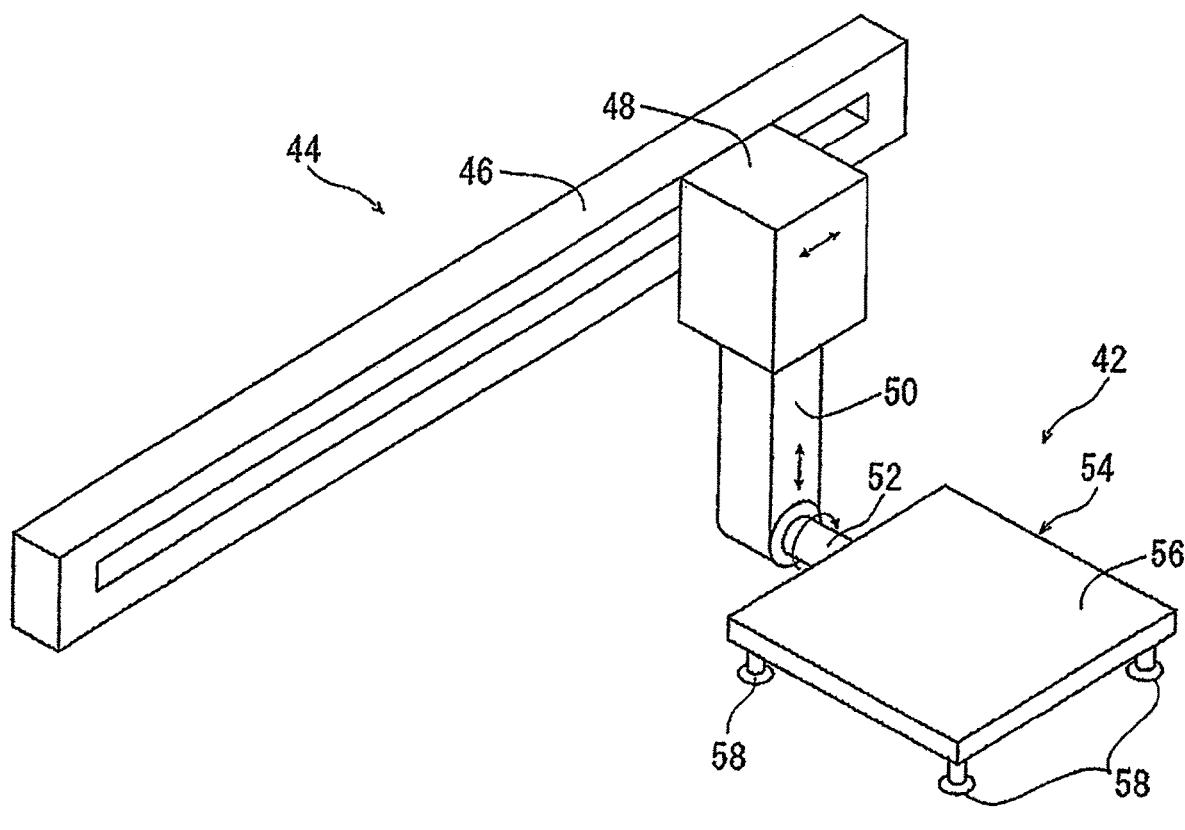
FIG. 4 is a perspective view of the first reversing unit and the first transport unit depicted in FIG. 1.

As depicted in FIG. 4, the first reversing unit 42 includes a rotatable shaft 52 supported for rotation at a lower end of the Z axis movable member 50 of the first transport unit 44 and extending in the X axis direction, a motor (not depicted) for rotating the rotatable shaft 52 around an axial line extending in the X axis direction, and a holding portion 54 that holds the frame 16 supported on the first temporary receiving unit 36. The holding portion 54 includes a base plate 56 connected to a free end of the rotatable shaft 52 and a plurality of suction pads 58 provided on one face of the base plate 56, and each of the suction pads 58 is connected to a suction unit (not depicted).

Thus, in the first reversing unit 42, the suction unit is rendered operative to cause the suction pads 58 to generate suction force such that the frame 16 supported on the first temporary receiving unit 36 is sucked to and held by the suction pads 58 of the holding portion 54 and the rotatable shaft 52 is rotated by 180 degrees by the motor to reverse the front and back of the frame 16 held by the holding portion 54.

Further, the first transport unit 44 is configured such that the Y axis movable member 48 is moved by the Y axis feeding unit and the Z axis movable member 50 is moved by the Z axis unit to move the first reversing unit 42 in the Y axis direction and the Z axis direction.

As depicted in FIG. 1, below one end in the Y axis direction (the left end in FIG. 1) of the housing 46 of the first transport unit 44, a second temporary receiving unit 62 is disposed which includes a pair of second guide rails 60 that support the frame 16 held on the first reversing unit 42 moved in the Y axis direction and extend in the X axis direction. The pair of second guide rails 60 are individually formed so as to have an L-shaped cross section and are disposed in a spaced relationship from each other in the Y axis direction such that they can support the frame 16, and are fixed by a suitable bracket (not depicted).

Describing with reference to FIGS. 1 and 3, a second carry-out/in unit 64 that moves a frame 16 supported on the second temporary receiving unit 62 in the X axis direction is disposed adjacent the second temporary receiving unit 62. The second carry-out/in unit 64 includes a housing 66 fixed through a suitable bracket (not depicted) and extending in the X axis direction, an X axis movable member 68 supported for movement in the X axis direction on the housing 66, and an X axis feeding unit (not depicted) for moving the X axis movable member 68 in the X axis direction. It is sufficient if the X axis feeding unit includes a ball screw connected to the X axis movable member 68 and extending in the X axis direction, and a motor for rotating the ball screw.

Description of the second carry-out/in unit 64 is continued with reference to FIG. 3. The X axis movable member 68 extends in the Y axis direction from a base end thereof supported on the housing 66, and a pair of grasping pieces 70 of the air driven type are mounted in a spaced relationship from each other in the Z axis direction on a one-side end face (in FIG. 3, an end face on the interior side) in the X axis direction on the free end side of the X axis movable member 68. The pair of grasping pieces 70 are positioned such that they can grasp a frame 16 supported on the second temporary receiving unit 62. Further, the pair of grasping pieces 70 are configured such that the distance therebetween can be expanded and contracted.

Further, the second carry-out/in unit 64 is configured such that, by reducing the distance between the pair of grasping pieces 70 after the X axis movable member 68 is moved by the X axis feeding unit to adjust the X axis direction position of the pair of grasping pieces 70, the frame 16 supported on the second temporary receiving unit 62 is grasped by the pair of grasping pieces 70. Further, the second carry-out/in unit 64 is configured such that the X axis feeding unit is rendered operative to move the frame 16 grasped by the pair of grasping pieces 70 in the X axis direction thereby to carry in the frame 16 to a third temporary receiving unit 72 described below from the second temporary receiving unit 62 and carry out the frame 16 from the third temporary receiving unit 72 into the second temporary receiving unit 62.

Figure 5B:
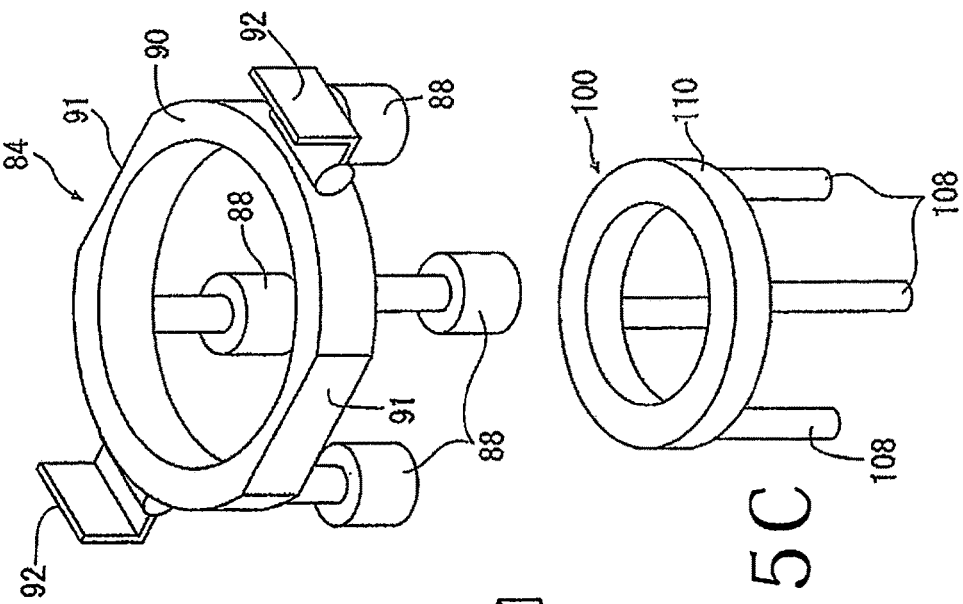
FIG. 5B is a perspective view of the frame lifting unit.
Figure 5C:
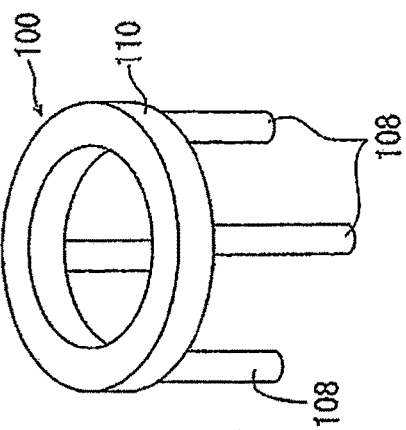
FIG. 5C is a perspective view of the tape contraction unit.
Figure 5A:
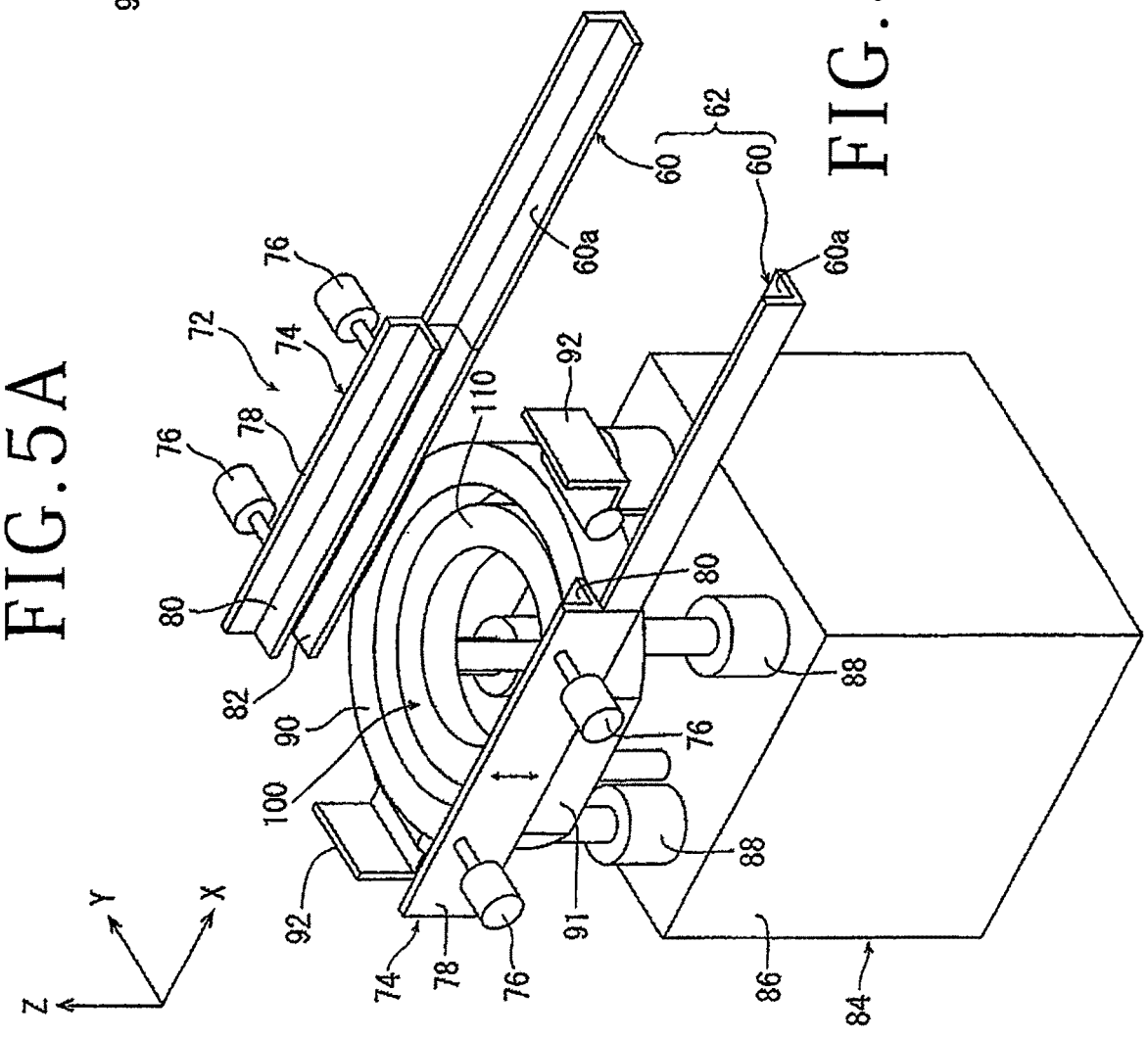
FIG. 5A is a perspective view of a second temporary receiving unit, a third temporary receiving unit, a frame lifting unit, and a tape contraction unit depicted in FIG. 1.

As depicted in FIGS. 3 and 5A, on one side in the X axis direction of the second temporary receiving unit 62, the third temporary receiving unit 72 is disposed. The third temporary receiving unit 72 includes a pair of third guide rails 74 that support a frame 16 moved by the second carry-out/in unit 64 and extend in the X axis direction, and a guide rail operation portion 76 that increases the distance between the pair of third guide rails 74 in the Y axis direction to permit passage of the frame 16 in the Z axis direction. In short, the distance between the pair of third guide rails 74 can be increased by the guide rail operation portion 76 such that passage of the frame 16 in the Z axis direction is permitted.

Description of the third temporary receiving unit 72 is continued with reference to FIG. 5A. In the embodiment depicted, the pair of third guide rails 74 of the third temporary receiving unit 72 are disposed in a spaced relationship from each other in the Y axis direction. The pair of third guide rails 74 include a side wall 78 extending in the X axis direction and an upper piece 80 and a lower piece 82 projecting from the side wall 78 in a spaced relationship from each other in the Z axis direction. In the pair of third guide rails 74 in the embodiment depicted, an upper stage guide rail portion at an upper portion in the Z axis direction is configured from the pair of upper pieces 80, and a lower stage guide rail portion at a lower portion in the Z axis direction is configured from the pair of lower pieces 82. In the following description, not only the upper piece but also the upper stage guide rail portion are denoted by reference numeral 80, and not only the lower piece but also the lower stage guide rail portion are denoted by reference numeral 82. In the pair of third guide rails 74, a frame 16 moved by the second carry-out/in unit 64 is supported by the upper stage guide rail portion 80 or the lower stage guide rail portion 82.

It is sufficient if the guide rail operation portion 76 is a plurality of air cylinders or electric cylinders connected to the pair of third guide rails 74, and the distance in the Y axis direction between the pair of third guide rails 74 is changed between a supporting position at which the frame 16 can be supported by the pair of third guide rails 74 and a permission position at which the distance between the pair of third guide rails 74 is made greater than that in the supporting position such that passage of the frame 16 in the Z axis direction is permitted.

Though not depicted, the third temporary receiving unit 72 further includes a guide rail lifting portion for moving the pair of third guide rails 74 in the Z axis direction. It is sufficient if the guide rail lifting portion is configured such that it includes a plurality of air cylinders or electric cylinders extending in the Z axis direction, and the guide rail lifting portion is configured such that it moves the pair of third guide rails 74 in the Z axis direction to position the upper stage guide rail portion (upper pieces) 80 or the lower stage guide rail portion (lower pieces) 82 to a height same as that of a frame holding face 60a of the second guide rails 60 of the second temporary receiving unit 62. It is to be noted that the pair of third guide rails 74 are supported for movement individually in the Y axis direction and the Z axis direction through suitable brackets (not depicted).

As depicted in FIG. 5A, at a lower portion in the Z axis direction of the third temporary receiving unit 72, a frame lifting unit 84 is disposed which supports a frame 16 supported on the third temporary receiving unit 72 for upward and downward movement in the Z axis direction. As depicted in FIG. 5B, the frame lifting unit 84 includes a base 86, a plurality of lifting portions 88 extending in the Z axis direction from an upper face of the base 86, and an annular frame supporting portion 90 connected to an upper end of the plurality of lifting portions 88 for supporting a frame 16. The lifting portions 88 can be configured from air cylinders or electric cylinders. A pair of flattened portions 91 are formed on an outer peripheral side face of the frame supporting portion 90, and the width of the frame supporting portions 90 in the Y axis direction is a little smaller than the width of the frame 16. Further, on an outer peripheral edge of the frame supporting portion 90, a plurality of clamps 92 for fixing the frame 16 to the frame supporting portion 90 are provided.

Thus, the frame lifting unit 84 is configured such that, if the frame supporting portion 90 is moved upwardly by the lifting portions 88 until the upper face of the frame supporting portion 90 is contacted with a lower face of a frame 16 supported on the pair of third guide rails 74 and then the pair of third guide rails 74 are positioned by the guide rail operation portions 76 of the third temporary receiving unit 72 to the permission position at which passage of the frame 16 in the Z axis direction is permitted, then the frame 16 supported on the third temporary receiving unit 72 is supported by the frame supporting portion 90 and is fixed to the frame supporting portion 90 by the plurality of clamps 92. Further, the frame lifting unit 84 is configured such that the frame 16 supported by the frame supporting portion 90 is moved upwardly or downwardly in the Z axis direction by rendering the plurality of lifting portions 88 operative.

As depicted in FIG. 3, at an upper portion in the Z axis direction of the third temporary receiving unit 72, a dividing unit 96 is disposed which includes a cylindrical portion 94 that is contacted, when a frame 16 supported on the frame lifting unit 84 is moved upwardly, with the adhesive tape 18 located between the frame 16 and the wafer 10 to expand the adhesive tape 18 thereby to divide the wafer 10 into individual chips along the scheduled division lines 12, and in the inside of the cylindrical portion 94, a suction table 98 is disposed which sucks and holds the wafer 10 divided into the chips to keep the distance between the chips while, on the frame lifting unit 84 side, a tape contraction unit 100 for heating the slackened adhesive tape 18 so as to be contracted is disposed.

Figures 6A, 6B:
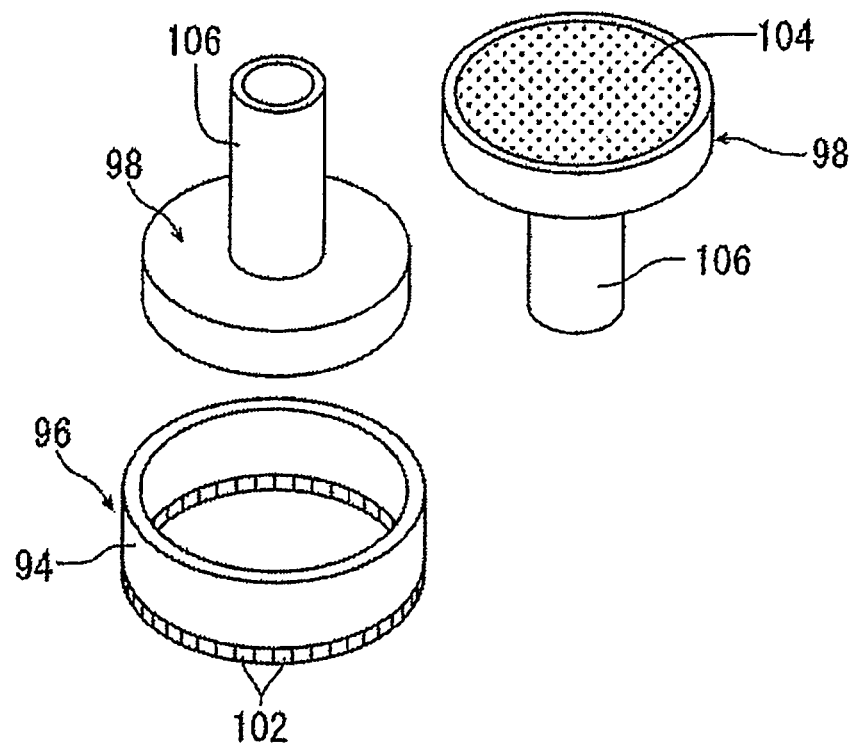
FIG. 6A is a perspective view of a dividing unit and a suction table depicted in FIG. 1 as viewed from above.
FIG. 6B is a perspective view of the suction table as viewed from below.

The dividing unit 96 is described with reference to FIGS. 3 and 6A. The cylindrical portion 94 of the dividing unit 96 is fixed through a suitable bracket (not depicted). Further, as depicted in FIG. 6A, a plurality of cylindrical rollers 102 are disposed at the lower end of the cylindrical portion 94 annularly and provided for rotation.

Further, the dividing unit 96 is configured such that, when a frame 16 supported on the frame lifting unit 84 is moved upwardly, the adhesive tape 18 located between the frame 16 and the wafer 10 is expanded by the cylindrical portion 94 and the wafer 10 is divided into individual chips corresponding to the devices along the scheduled division lines 12. Further, in the embodiment depicted, when the plurality of rollers provided at the lower end of the cylindrical portion 94 are contacted with the adhesive tape 18, the cylindrical rollers 102 are rotated to reduce the frictional resistance between the cylindrical rollers 102 and the adhesive tape 18, and the expansion of the adhesive tape 18 is performed smoothly.

The suction table 98 is described with reference to FIGS. 3, 6A, and 6B. The suction table 98 is formed in a disk shape and is fixed through a suitable bracket (not depicted). As depicted in FIG. 6B, a porous circular suction chuck 104 is disposed on a lower face of the suction table 98 and is connected to a suction unit (not depicted) through a cylindrical flow path member 106 extending upwardly from an upper face of the suction table 98. Further, a lower face position of the suction chuck 104 matches a lower end position of the cylindrical portion 94 of the dividing unit 96. Thus, the suction table 98 is configured such that, by generating suction force at the lower face of the suction chuck 104 by the suction unit after a wafer 10 is divided into individual chips by the dividing unit 96, the wafer 10 divided into chips is sucked and held thereby to keep the distance between the chips to the distance at the time of division of the wafer 10.

In the embodiment depicted, as depicted in FIG. 5C, the tape contraction unit 100 includes a plurality of props 108 extending upwardly from an upper face of the base 86 of the frame lifting unit 84, and an annular heater 110 connected to an upper end of the plurality of props 108. Hot air is jetted upwardly from an upper face of the heater 110, and the temperature of the hot air at the upper end of the heater 110 is set, for example, at 250° C.

Thus, the tape contraction unit 100 is configured such that, when a frame 16 supported on the frame lifting unit 84 is moved down in a state in which, after the wafer 10 is divided into individual chips by the dividing unit 96, the wafer 10 divided into chips is sucked to and held by the suction table 98 thereby to keep the distance between the chips, hot air is jetted from the heater 110 to heat the adhesive tape 18, which is located between the wafer 10 and the frame 16 and is in a slackened state, so as to be contracted.

As depicted in FIG. 1, the wafer dividing apparatus 2 includes a second transport unit 112 that transports a frame 16, which is carried out from the third temporary receiving unit 72 into the second temporary receiving unit 62 by the second carry-out/in unit 64 and in which the adhesive tape 18 is in a contracted state, to the first temporary receiving unit 36.

The second transport unit 112 is described with reference to FIGS. 1 and 7. The second transport unit 112 includes a housing 114 fixed to the housing 46 of the first transport unit 44 in a spaced relationship in the X axis direction through a suitable bracket (not depicted) and extending in the Y axis direction, a Y axis movable member 116 supported for movement in the Y axis direction on the housing 114, a Y axis feeding unit (not depicted) for moving the Y axis movable member 116 in the Y axis direction, a Z axis movable member 118 supported for movement in the Z axis direction on the Y axis movable member 116, and a Z axis feeding unit (not depicted) for moving the Z axis movable member 118 in the Z axis direction. It is sufficient if the Y axis feeding unit is configured such that it includes a ball screw connected to the Y axis movable member 116 and extending in the Y axis direction and a motor for rotating the ball screw, and it is sufficient if the Z axis feeding unit is configured such that it includes a ball screw connected to the Z axis movable member 118 and extending in the Z axis direction, and a motor for rotating this ball screw.

Figure 7:
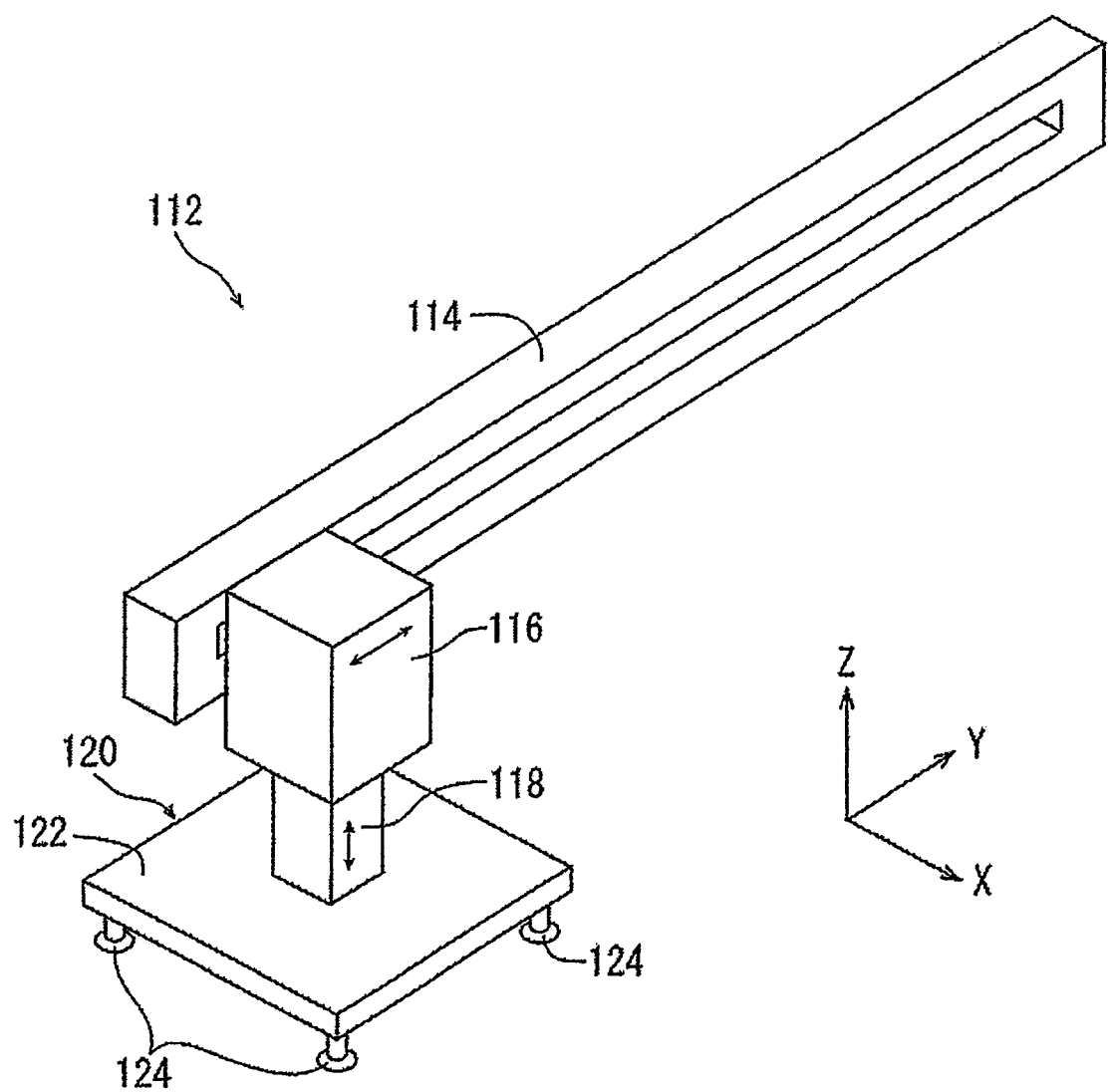
FIG. 7 is a perspective view of the second transport unit depicted in FIG. 1.

As depicted in FIG. 7, the second transport unit 112 further includes a holding portion 120 for holding a frame 16 supported on the second temporary receiving unit 62. The holding portion 120 includes a base plate 122 connected to a lower end of the Z axis movable member 118 and a plurality of suction pads 124 provided on the lower face of the base plate 122, and each of the suction pads 124 is connected to a suction unit (not depicted).

Thus, the second transport unit 112 is configured such that, by rendering the suction unit operative to generate suction force at the suction pads 124, the frame 16, which is carried out from the third temporary receiving unit 72 into the second temporary receiving unit 62 by the second carry-out/in unit 64 and in which the adhesive tape 18 is contracted, is sucked to and held by the suction pads 124 of the holding portion 120. Further, the second transport unit 112 is configured such that, by moving the Y axis movable member 116 by the Y axis feeding unit and moving the Z axis movable member 118 by the Z axis feeding unit, the frame 16 sucked to and held by the holding portion 120 is transported from the second temporary receiving unit 62 to the first temporary receiving unit 36.

As depicted in FIG. 3, preferably the wafer dividing apparatus 2 further includes a cleaning unit 126 disposed on the opposite side to the cassette table 4 across the first temporary receiving unit 36 and configured to clean a wafer 10 supported on the frame 16, and a third carry-out/in unit 128 that carries in a frame 16, which supports a wafer 10 transported to the first temporary receiving unit 36, to the cleaning unit 126 or carries out the frame 16 from the cleaning unit 126.

In the embodiment depicted, as depicted in FIG. 3, the third carry-out/in unit 128 is configured from a pair of holding pieces 130 of the air driven type mounted in a spaced relationship from each other in the Z axis direction on the other side end face in the X axis direction (in FIG. 3, on the interior side end face) on the free end side of the Z axis movable member 32 of the first carry-out/in unit 26. Further, the pair of holding pieces 130 are configured such that the distance therebetween can be expanded and contracted.

Further, the third carry-out/in unit 128 is configured such that, by decreasing the distance between the pair of holding pieces 130 after the X axis direction position and the Z axis direction position of the pair of holding pieces 130 are adjusted by moving the X axis movable member 30 and the Z axis movable member 32 by the X axis feeding unit and the Z axis feeding unit of the first carry-out/in unit 26, the frame 16 supporting the wafer 10 transported to the first temporary receiving unit 36 is held by the pair of holding pieces 130. As can be recognized by referring to FIG. 3, the pair of holding pieces 130 are greater than the pair of grasping pieces 34 of the first carry-out/in unit 26 and can hold the frame 16 with a higher degree of certainty in comparison with the grasping pieces 34. Further, the third carry-out/in unit 128 is configured such that, by rendering the X axis feeding unit and the Z axis feeding unit of the first carry-out/in unit 26, the frame 16 held by the pair of holding pieces 130 is carried into the cleaning unit 126 from the first temporary receiving unit 36 and the frame 16 is carried out from the cleaning unit 126 into the first temporary receiving unit 36.

It is to be noted that the third carry-out/in unit 128 of the embodiment depicted uses the housing 28, the X axis movable member 30, the X axis feeding unit, the Z axis movable member 32, and the Z axis feeding unit of the first carry-out/in unit 26 in common, it may otherwise include a housing, an X axis movable member, an X axis feeding unit, a Z axis movable member, and a Z axis feeding unit separate from those of the first carry-out/in unit 26.

Figure 8A:
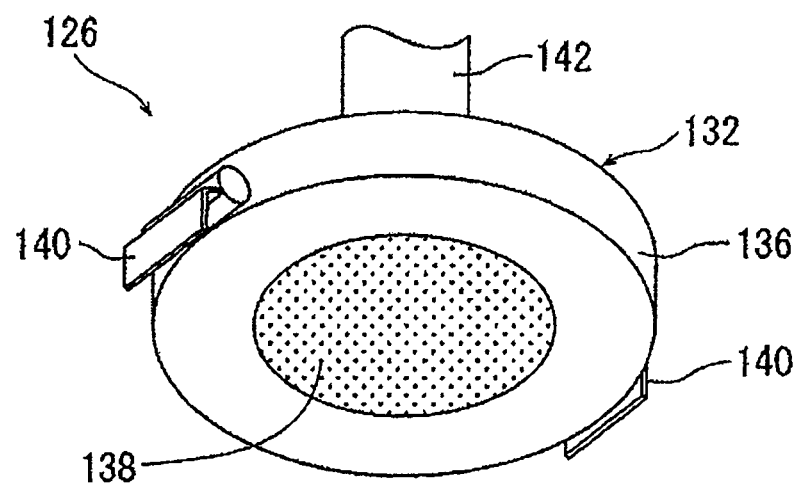
FIG. 8A is a perspective view of a cleaning unit depicted in FIG. 1 as viewed from below.
Figure 8B:
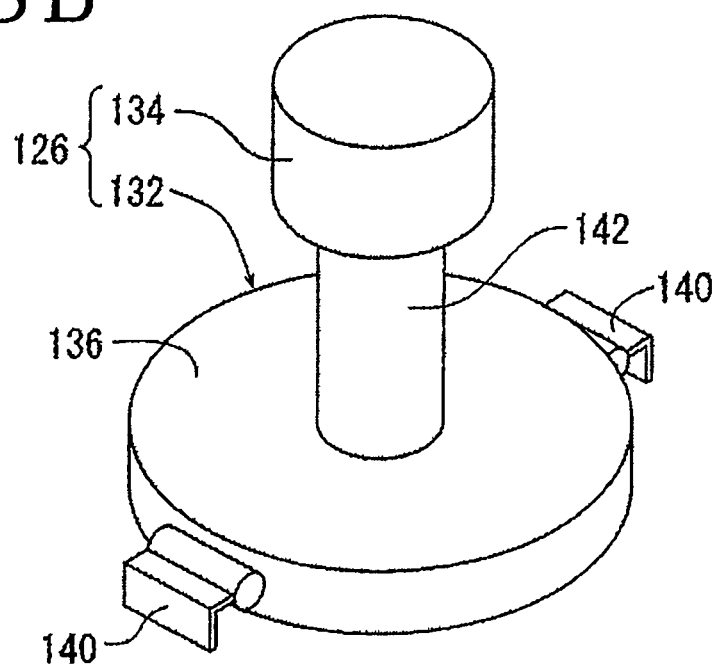
FIG. 8B is a perspective view of the cleaning unit as viewed from above.

The cleaning unit 126 is described with reference to FIGS. 8A and 8B. The cleaning unit 126 includes a holding portion 132 for holding a frame 16 carried in by the third carry-out/in unit 128, and a motor 134 for rotating the holding portion 132. The holding portion 132 includes a disk-shaped holding plate 136 supported for rotation through a suitable bracket (not depicted), a porous suction chuck 138 disposed on a lower face of the holding plate 136 and connected to a suction unit (not detected), and a plurality of clamps 140 provided on a circumferential edge of the holding plate 136. The motor 134 is disposed above the holding plate 136, and a rotatable shaft 142 extending downwardly from the motor 134 is connected to an upper face of the holding plate 136. Further, below the holding plate 136, a cleaning water jetting unit (not depicted) for jetting cleaning water toward the lower face of the holding plate 136 and a dry air jetting unit (not depicted) for jetting dry air toward the lower face of the holding plate 136 are disposed.

Thus, the cleaning unit 126 is configured such that the suction unit is rendered operative to generate suction force at the suction chuck 138 such that a wafer 10 supported on a frame 16 carried in by the third carry-out/in unit 128 in a state in which the wafer 10 is directed downwardly is sucked and held by the suction chuck 138 from the adhesive tape 18 side and the frame 16 is fixed to the holding plate 136 by the plurality of clamps 140 to receive the frame 16 from the third carry-out/in unit 128. Further, in the cleaning unit 126, by jetting cleaning water from the cleaning water jetting unit while the holding plate 136 is rotated by the motor 134, the wafer 10 can be cleaned, and by centrifugal force by rotation of the holding plate 136, the cleaning water can be removed from the wafer 10. Furthermore, by jetting dry air from the dry air jetting unit, cleaning water that has not been removed by the centrifugal force by the rotation of the holding plate 136 can be removed from the wafer 10 to dry the wafer 10.

In the embodiment depicted, as depicted in FIG. 3, the wafer dividing apparatus 2 further includes a transparent table 144 disposed just below the first temporary receiving unit 36 and including a transparent plate of a size corresponding to the size of the wafer 10, a second reversing unit 146 that includes a holding portion that is disposed at an upper portion of the transparent table 144 for holding a frame 16 that supports the cleaned wafer 10 carried out into the first temporary receiving unit 36 by the third carry-out/in unit 128 and rotates by 180 degrees to reverse the front and back of the frame 16 and then places the frame 16 on the transparent table 144, a lifting unit 148 for moving the second reversing unit 146 upwardly and downwardly between the transparent table 144 and the first temporary receiving unit 36, and a table moving unit 150 that moves the transparent table 144, on which the frame 16 in the state in which the wafer 10 is directed upwardly by the reversal between the front and back by the second reversing unit 146 is placed, from just below the first temporary receiving unit 36 in a direction toward the second temporary receiving unit 62.

The transparent table 144 is described with reference to FIGS. 9A and 9B. The transparent table 144 is formed as a rectangular plate, and is mounted for movement in the Y axis direction on a pair of guide rails 152 disposed in a spaced relationship from each other in the X axis direction and extending in the Y axis direction. At a middle portion of the transparent table 144, a transparent plate 154 (for example, a glass plate) of a circular shape a little greater than the size of the wafer 10 is disposed. Further, on the transparent table 144, a plurality of frame suction holes 156 connected to a suction unit (not depicted) are formed, and the plurality of frame suction holes 156 are disposed around the transparent plate 154. Further, the transparent table 144 is configured such that, by generating suction force at the frame suction holes 156 by the suction unit, a frame 16 placed on an upper face of the transparent table 144 is sucked and held. It is to be noted that any other portion of the transparent table 144 than the transparent plate 154 is not transparent.

As depicted in FIG. 9B, the table moving unit 150 includes a ball screw 158 connected at a nut portion 158a thereof to the transparent table 144 and extending in the Y axis direction, and a motor 160 for rotating the ball screw 158. Further, the table moving unit 150 is configured such that rotational motion of the motor 160 is converted into linear motion by the ball screw 158 and transmitted to the transparent table 144 to move the transparent table 144 immediately below the first temporary receiving unit 36 along the pair of guide rails 152 in the direction toward the second temporary receiving unit 62 (Y axis direction).

The lifting unit 148 is described with reference to FIG. 10. The lifting unit 148 includes a housing 162 extending in the Z axis direction, a Z axis movable member 164 supported for movement in the Z axis direction on the housing 162, and a Z axis feeding unit (not depicted) for moving the Z axis movable member 164 upwardly and downwardly in the Z axis direction. It is sufficient if the Z axis feeding unit is configured such that it includes a ball screw connected to the Z axis movable member 164 and extending in the Z axis direction and a motor for rotating this ball screw.

Figure 10:
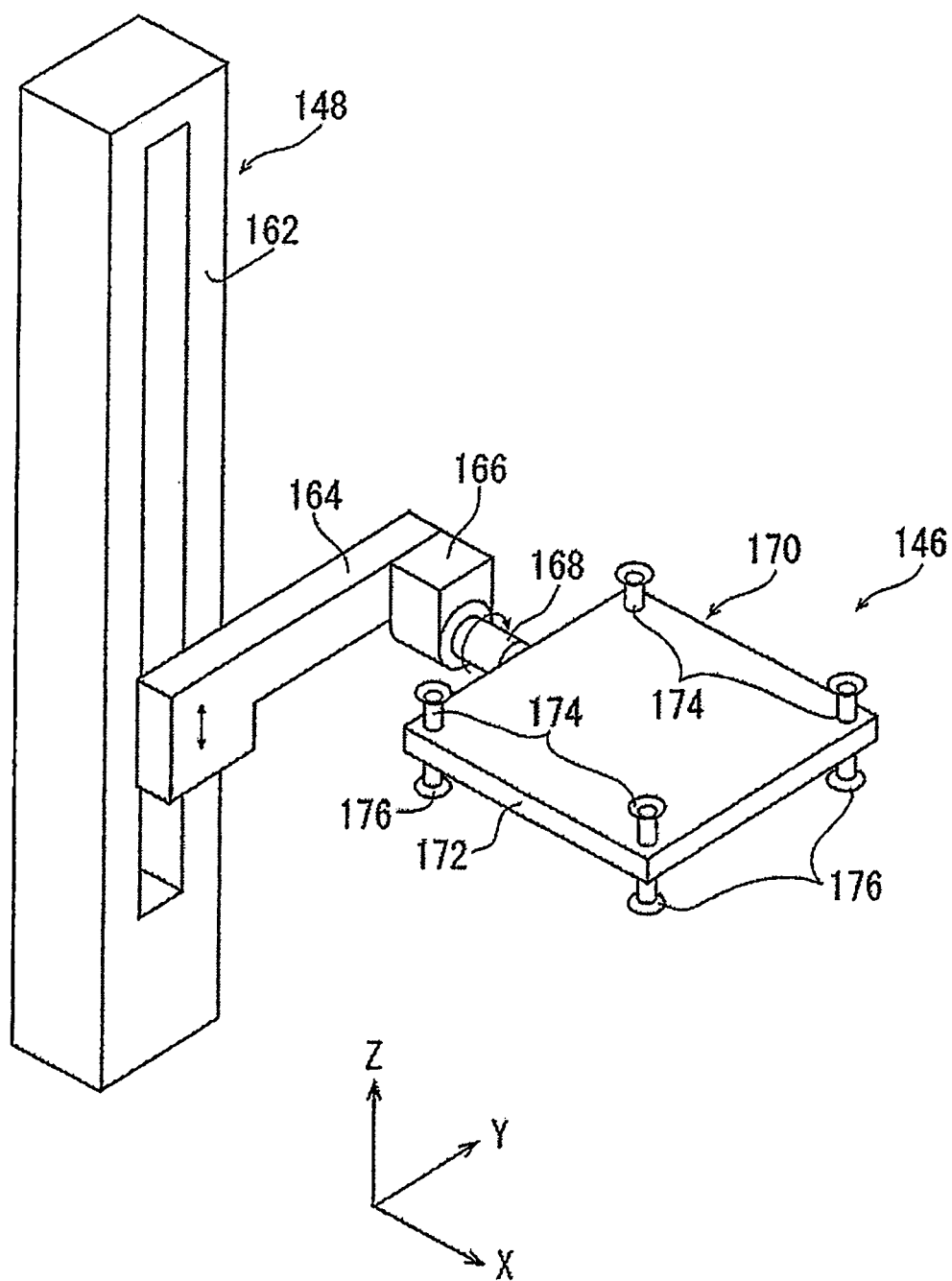
FIG. 10 is a perspective view of the second inversion unit and the lifting unit depicted in FIG. 1.

As depicted in FIGS. 3 and 10, the second reversing unit 146 includes a rotatable shaft supporting member 166 mounted at a free end of the Z axis movable member 164 of the lifting unit 148, a rotatable shaft 168 supported for rotation on the rotatable shaft supporting member 166 and extending in the X axis direction, a motor (not depicted) for rotating the rotatable shaft 168 around an axial line extending in the X axis direction, and a holding portion 170 disposed above the transparent table 144 for holding a frame 16 that supports a cleaned wafer 10 carried out into the first temporary receiving unit 36 by the third carry-out/in unit 128.

Description of the second reversing unit 146 is continued with reference to FIG. 10. The holding portion 170 of the second reversing unit 146 includes a base plate 172 connected to a free end of the rotatable shaft 168, a plurality of suction pads 174 provided on one face of the base plate 172, and a plurality of suction pads 176 provided on the other face of the base plate 172, and the suction pads 174 and 176 are connected to a suction unit (not depicted). In the holding portion 170 of the second reversing unit 146 in the embodiment depicted, one holding portion (a first holding portion) is configured from the plurality of suction pads 174 provided on the one face of the base plate 172, and the other holding portion (a second holding portion) is configured from a plurality of suction pads 176 provided on the other face of the base plate 172. In the following description, not only the suction pads on the one face of the base plate 172 but also the one holding portion are denoted by reference numeral 174, and not only the suction pads on the other face of the base plate 172 but also the other holding portion are denoted by reference numeral 176.

The second reversing unit 146 is configured such that, by rendering the suction unit operative to generate suction force at the one holding portion 174 or the other holding portion 176, a frame 16 that supports a cleaned wafer 10 carried out into the first temporary receiving unit 36 by the third carry-out/in unit 128 is sucked to and held by the one holding portion 174 or the other holding portion 176.

Further, the lifting unit 148 is configured such that, by moving the Z axis movable member 164 upwardly and downwardly by the Z axis feeding unit, the second reversing unit 146 is moved upwardly and downwardly between the transparent table 144 and the first temporary receiving unit 36.

As depicted in FIGS. 1 and 3, below the second temporary receiving unit 62, a chamber 178 is disposed which covers a wafer 10 supported on a frame 16 placed on the transparent table 144 moved by the table moving unit 150 and into which inert gas is supplied.

The chamber 178 includes a circular top wall 180, a cylindrical skirt wall 182 extending downwardly from a circumferential edge of the top wall 180, and a cylindrical inert gas supplying portion 184 extending upwardly from a middle portion of an upper face of the circular top wall 180. A plurality of open air holes 186 are formed on a circumferential edge side portion of the circular top wall 180, and the inert gas supplying portion 184 is connected to an inert gas supplying unit (not depicted). Further, the chamber 178 is supported for upward and downward movement on a suitable bracket (not depicted), and a chamber lifting unit (not depicted) for moving the chamber 178 upwardly and downwardly is connected to the chamber 178. The chamber lifting unit is configured from an air cylinder of an electric cylinder connected to the top wall 180.

Further, the chamber 178 is configured such that, if the transparent table 144 moves to the lower side of the chamber 178 by the table moving unit 150, then a wafer 10 supported on a frame 16 moved down by the chamber lifting unit and placed on the transparent table 144 is covered with the circular top wall 180 and the skirt wall 182. Further, after the wafer 10 is covered by the chamber 178, inert gas (for example, nitrogen ($N_2$) gas) is supplied into the chamber 178 from the inert gas supplying unit such that the oxygen ($O_2$) in the chamber 178 can be discharged from the open air holes 186.

As depicted in FIGS. 1 and 3, below the chamber 178, a UV irradiation unit 188 for irradiating ultraviolet rays upon the adhesive tape 18 stuck to the frame 16 is disposed. The UV irradiation unit 188 includes a housing 190, a circular transparent plate 192 (for example, a glass plate) disposed on an upper face of the housing 190, and an ultraviolet light source (not depicted) disposed below the transparent plate 192 for irradiating ultraviolet rays. The size of the transparent plate 192 is a little greater than the size of the wafer 10.

Thus, the UV irradiation unit 188 is configured such that, after a wafer 10 supported on a frame 16 placed on the transparent table 144 is covered with the chamber 178 and then inert gas is supplied into the chamber 178, ultraviolet rays are irradiated from the ultraviolet light source upon the adhesive tape 18 stuck to the frame 16 to decrease the adhesive force of the adhesive tape 18. This makes it possible to pick up a chip smoothly at a step of picking up a chip from the adhesive tape 18. Further, in the embodiment depicted, since inert gas is supplied into the chamber 178 and oxygen is discharged from within the chamber 178, it can be suppressed that the adhesiveness of the adhesive layer of the adhesive tape 18 becomes liable to be maintained by reaction between the adhesive layer and oxygen, and the adhesive force of the adhesive tape 18 can be reduced effectively.

Now, a wafer dividing method of dividing a wafer 10 adhered to an adhesive tape 18 and supported at the opening 16a of a frame 16 into individual chips corresponding to individual devices 14 along scheduled division lines 12 using such wafer dividing apparatus 2 as described above is described.

In the wafer dividing method that uses the wafer dividing apparatus 2, a cassette placement step of placing a cassette 8, which accommodates a plurality of wafers 10 each adhered to an adhesive tape 18 and supported at the opening 16a of a frame 16, on the cassette table 4 is performed first. In the cassette 8, the front face 10a of each wafer 10 is directed upwardly and the wafer 10 is positioned on the upper side and the adhesive tape 18 is positioned on the lower side. Further as described hereinabove, in each wafer 10 in the cassette 8, a modified layer as a division start point at which the strength is reduced is formed along each scheduled division line 12.

After the cassette placement step is performed, a first carry-in step of grasping a frame 16 with the pair of grasping pieces 34 of the first carry-out/in unit 26 and carrying the frame 16 from the cassette 8 placed on the cassette table 4 into the first temporary receiving unit 36 is performed.

At the first carry-in step, the X axis movable member 30 and the Z axis movable member 32 are moved by the X axis feeding unit and the Z axis feeding unit of the first carry-out/in unit 26 to position the pair of grasping pieces 34 at an end portion of an arbitrary frame 16 in the cassette 8. Then, an end portion of the frame 16 is grasped by the pair of grasping pieces 34, and the frame 16 is moved in the X axis direction by the X axis feeding unit of the first carry-out/in unit 26 such that the frame 16 is carried from the cassette 8 placed in the cassette table 4 into the first temporary receiving unit 36. Then, the grasping of the frame 16 by the pair of grasping pieces 34 is cancelled to allow the frame 16 to be supported by the first temporary receiving unit 36. It is to be noted that, at the time of the first carry-in step, the pair of first guide rails 38 are positioned at the supporting position at which they can support the frame 16. Further, when the frame 16 is supported by the first temporary receiving unit 36, the wafer 10 is positioned on the upper side while the adhesive tape 18 is positioned on the lower side.

After the first carry-in step is performed, a first reversing step of holding the frame 16 supported on the first temporary receiving unit 36 with the holding portion 54 of the first reversing unit 42 and rotating the rotatable shaft 52 of the X axis direction by 180 degrees to reverse the front and back of the frame 16 is performed.

At the first reversing step, the Y axis movable member 48 and the Z axis movable member 50 are first moved by the Y axis feeding unit and the Z axis feeding unit of the first transport unit 44, and the holding portion 54 with the suction pads 58 of the first reversing unit 42 directed upwardly is positioned below the first temporary receiving unit 36. Then, the first carry-in step is carried out, and thereafter, the holding portion 54 is moved upwardly by the Z axis feeding unit of the first transport unit 44 until the suction pads 58 is closely contacted with the frame 16. Then, the suction unit connected to the suction pads 58 is rendered operative to generate suction force at the suction pads 58 to suck and hold the frame 16 with the suction pads 58. Then, the holding portion 54 is further moved upwardly by the Z axis feeding unit of the first transport unit 44 such that the frame 16 sucked to and held on the suction pads 58 is moved upwardly away from the first temporary receiving unit 36. Then, the rotatable shaft 52 is rotated by 180 degrees by the motor of the first reversing unit 42 to reverse the front and back of the frame 16 sucked to and held by the suction pads 58. Consequently, the front face 10a of the wafer 10 comes to be directed downwardly, and the wafer 10 is positioned on the lower side and the adhesive tape 18 is positioned on the upper side.

After the first reversing step is carried out, a first transport step of moving the first reversing unit 42 in the Y axis direction by the first transport unit 44 until the frame 16 held by the holding portion 54 of the first reversing unit 42 is transported to and supported by the second temporary receiving unit 62.

At the first transport step, the first reversing unit 42 is moved in the Y axis direction by the Y axis feeding unit of the first transport unit 44 until the holding portion 54 of the first reversing unit 42 is transported to a position above the second temporary receiving unit 62. Then, the holding portion 54 is moved downwardly by the Z axis feeding unit of the first transport unit 44 until the frame 16 sucked to and held on the suction pads 58 of the holding portion 54 is brought into contact with the frame holding face 60a of the second guide rails 60 of the second temporary receiving unit 62. Then, the operation of the suction unit connected to the suction pads 58 is stopped to cancel the suction force of the suction pads 58 thereby to allow the frame 16 to be supported on the second temporary receiving unit 62. It is to be noted that, when the frame 16 is supported by the second temporary receiving unit 62, the wafer 10 is positioned on the lower side while the adhesive tape 18 is positioned on the upper side.

After the first transport step is carried out, a second carry-in step of grasping the frame 16 supported on the second temporary receiving unit 62 with the pair of grasping pieces 70 of the second carry-out/in unit 64 and moving in the X axis direction to carry in the frame 16 from the second temporary receiving unit 62 to the third temporary receiving unit 72.

At the second carry-in step, the X axis movable member 68 is first moved by the X axis feeding unit of the second carry-out/in unit 64 to position the pair of grasping pieces 70 to an end portion of the frame 16 supported on the second temporary receiving unit 62. Then, after an end portion of the frame 16 is grasped by the pair of grasping pieces 70, the frame 16 is moved in the X axis direction by the X axis feeding unit of the second carry-out/in unit 64 to carry in the frame 16 from the second temporary receiving unit 62 to the upper stage guide rail portion 80 or the lower stage guide rail portion 82 of the third temporary receiving unit 72. Then, the grasping of the frame 16 by the pair of grasping pieces 70 is cancelled to allow the frame 16 to be supported by the upper stage guide rail portion 80 or the lower stage guide rail portion 82. It is to be noted that, at the time of the second carry-in step, the upper stage guide rail portion 80 or the lower stage guide rail portion 82 is positioned at the supporting position at which it can support the frame 16 and is positioned at a height same as that of the frame holding face 60a of the second guide rails 60 of the second temporary receiving unit 62. Further, when the frame 16 is supported by the third temporary receiving unit 72, the wafer 10 is positioned on the lower side and the adhesive tape 18 is positioned on the upper side.

After the second carry-in step is performed, a dividing step of supporting and moving the frame 16 supported on the third temporary receiving unit 72 upwardly in the Z axis direction by the frame lifting unit 84 to expand the adhesive tape 18 positioned between the frame 16 and the wafer 10 with the cylindrical portion 94 of the dividing unit 96 thereby to divide the wafer 10 into individual chips for individual devices 14 along scheduled division lines 12.

Figure 11:
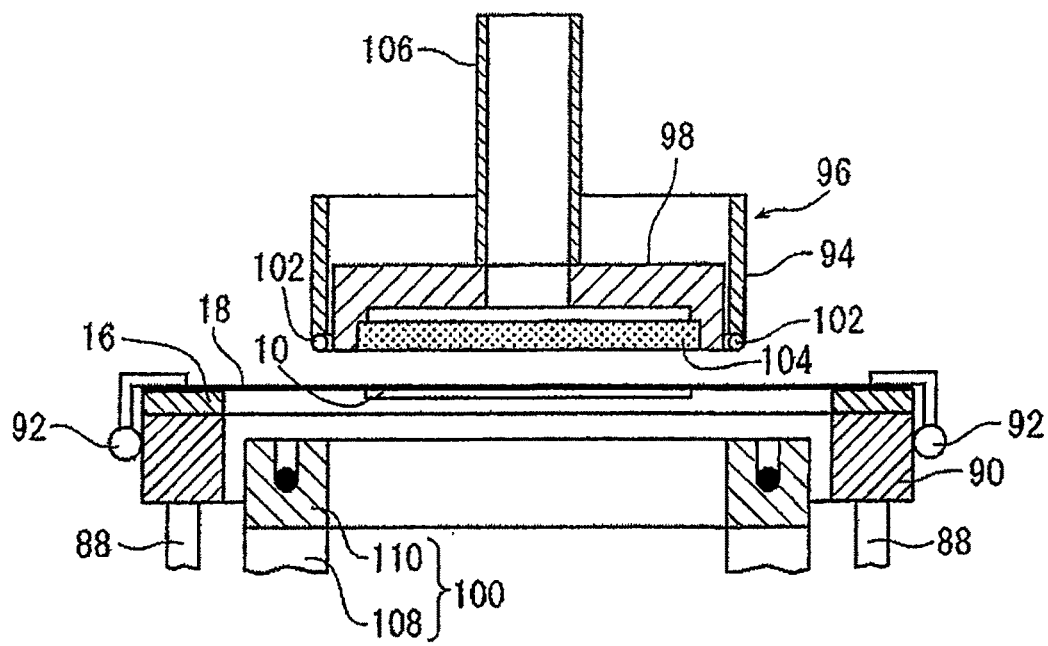
FIG. 11 is a sectional view depicting a state in which a frame is fixed to a frame supporting portion of the frame lifting unit.
Figure 12:
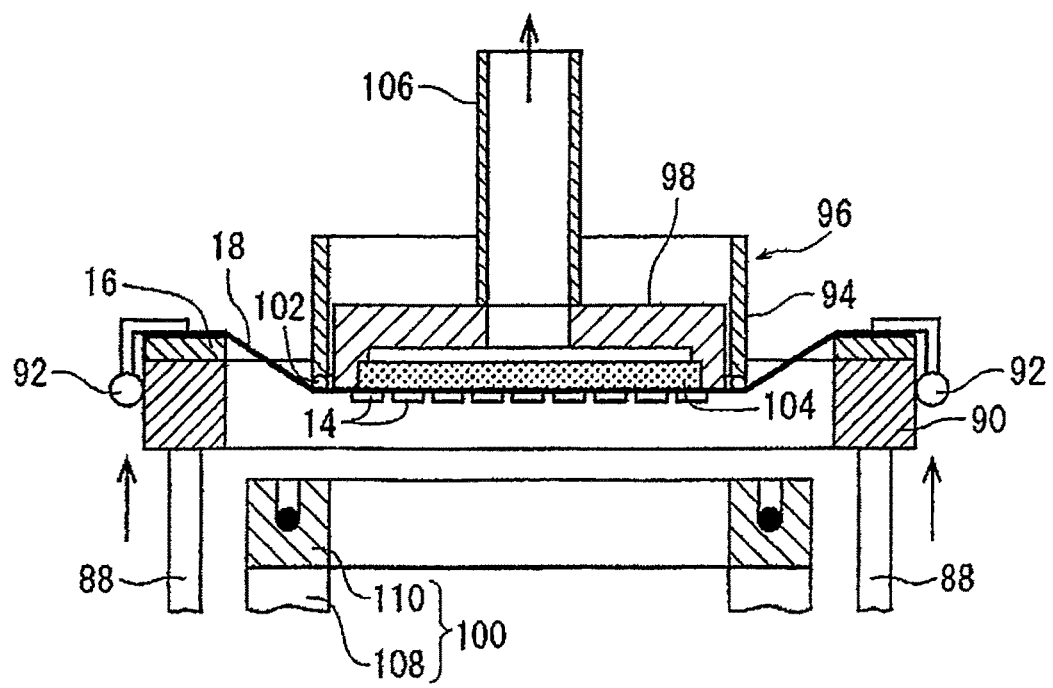
FIG. 12 is a sectional view depicting a state in which a wafer is divided into chips for individual devices.

At the dividing step, the distance between the pair of third guide rails 74 is expanded by the guide rail operation portion 76 of the third temporary receiving unit 72 and the frame supporting portion 90 is moved upwardly to transfer the frame 16 from the third temporary receiving unit 72 to the frame supporting portion 90 of the frame lifting unit 84. Then, as depicted in FIG. 11, the frame 16 is fixed to the frame supporting portion 90 by a plurality of clamps 92. Then, the lifting portion 88 of the frame lifting units 84 is rendered operative to move the frame 16 fixed to the frame supporting portion 90 upwardly in the Z axis direction such that the adhesive tape 18 positioned between the frame 16 and the wafer 10 is expanded by the cylindrical portion 94 of the dividing unit 96 thereby to divide the wafer 10 into individual chips for individual devices 14 along scheduled division lines 12 as depicted in FIG. 12. In the embodiment depicted, as depicted in FIGS. 11 and 12, at the dividing step, the wafer 10 is positioned on the lower side and the adhesive tape 18 is positioned on the upper side. By applying external force to the wafer 10 in the state in which the wafer 10 stuck to the adhesive tape 18 is directed downwardly to divide the wafer 10 into individual chips in this manner, dust, which scatters when the wafer 10 is divided into individual chips, does not stick to the surface of the chips, and degradation of the quality of the chips can be prevented.

After the dividing step is performed, a suction step of sucking and holding the wafer 10 divided into the chips for the individual devices 14 by the suction table 98 thereby to maintain the distance between the chips is performed.

At the suction step, suction force is generated on the lower face of the suction chuck 104 of the suction table 98 to suck and hold the wafer 10 divided into the chips for the individual devices 14 by the suction table 98. By this, the distance between the chips can be maintained to the distance when the wafer 10 was divided into the chips.

After the suction step is performed, a tape contraction step of heating, while the wafer 10 divided into the chips is left in the state in which it is sucked to and held by the suction table 98, the slackened adhesive tape 18 positioned between the wafer 10 divided into the chips and the frame 16 by the tape contraction unit 100 to contract the tape.

Figure 13:
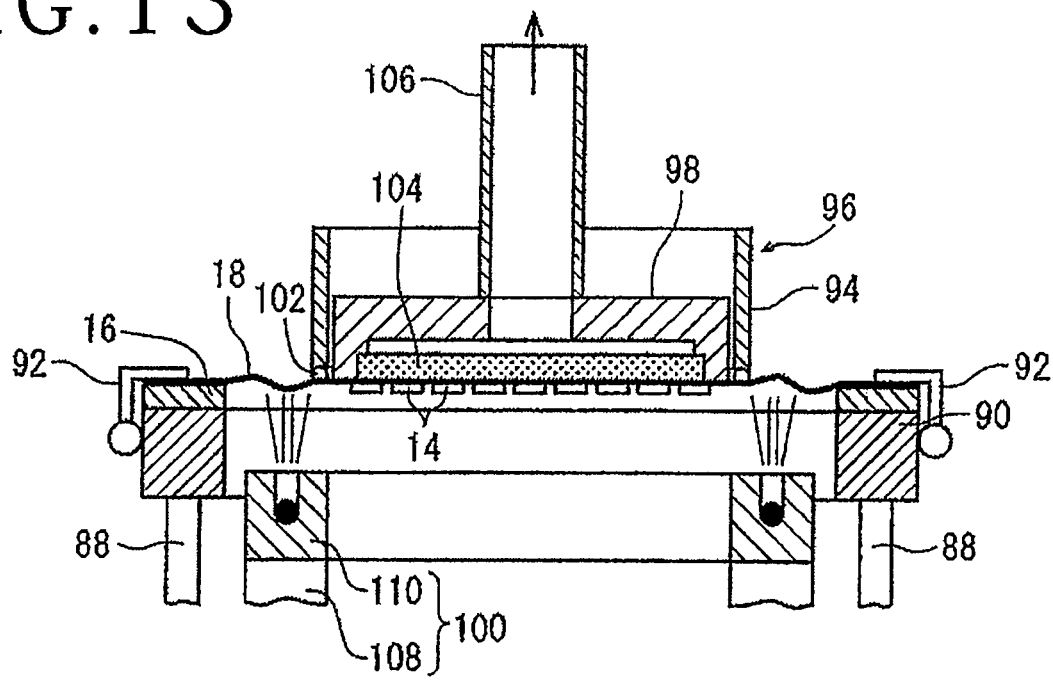
FIG. 13 is a sectional view depicting a state in which the distance between chips is kept to a distance upon division of the wafer by the suction table and a slackened adhesive tape located between the frame and the wafer is heated.
Figure 14:
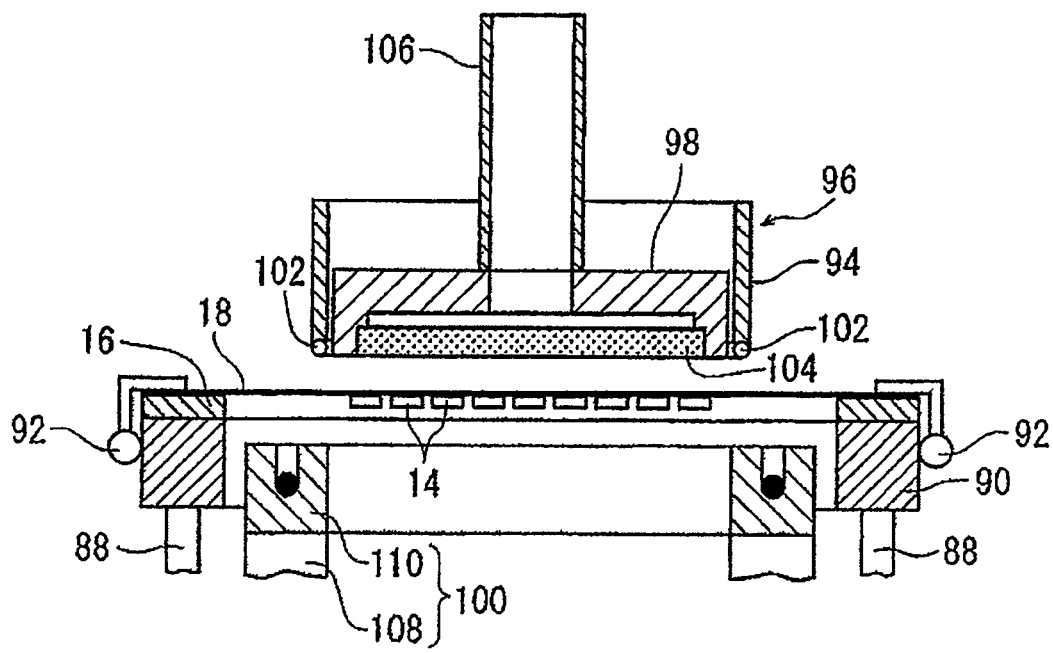
FIG. 14 is a sectional view depicting a state in which, because the adhesive tape located between the frame and the wafer is contracted, even if suction by the suction table is canceled, the distance between chips is kept to the distance upon division of the wafer.

At the tape contraction step, the frame supporting portion 90 is first moved down by the lifting portion 88 of the frame lifting unit 84 until the height of the frame 16 matches the height of the wafer 10 divided into the chips as depicted in FIG. 13. At this time, the state in which the wafer 10 divided into the chips is sucked to and held by the suction table 98 is continued thereby to maintain the distance between the chips to the distance at the time of division of the wafer 10. Then, hot air is jetted upwardly from the upper face of the heater 110 of the tape contraction unit 100 to heat the slackened adhesive tape 18 located between the wafer 10 divided into the chips and the frame 16 so as to be contracted. By this, even if the suction force of the suction table 98 is cancelled, the distance between the chips is maintained to the distance at the time of division of the wafer 10 as depicted in FIG. 14.

After the tape contraction step is performed, a first carry-out step of carrying out the frame 16 having the contracted adhesive tape 18 from the frame lifting unit 84 to the second temporary receiving unit 62 is performed.

At the first carry-out step, the pair of third guide rails 74 are first moved upwardly by the guide rail lifting portion of the third temporary receiving unit 72 until the height of the upper stage guide rail portion 80 matches the height of the frame 16. Then, the fixation of the frame 16 by the plurality of clamps 92 is cancelled. Then, the distance between the pair of third guide rails 74 is reduced from that at the passage position to that at the support position by the guide rail operation portion 76 such that the frame 16 is transferred from the frame supporting portion 90 of the frame lifting unit 84 to the upper stage guide rail portion 80 of the third temporary receiving unit 72.

Then, the X axis movable member 68 is moved by the X axis feeding unit of the second carry-out/in unit 64 to position the pair of grasping pieces 70 to an end portion of the frame 16 supported on the third temporary receiving unit 72. Then, after an end portion of the frame 16 is grasped by the pair of grasping pieces 70, the frame 16 is moved in the X axis direction by the X axis feeding unit of the second carry-out/in unit 64 to carry out the frame 16 from the third temporary receiving unit 72 to the second temporary receiving unit 62. Then, the grasping of the frame 16 by the pair of grasping pieces 70 is cancelled thereby to allow the frame 16 to be supported on the second temporary receiving unit 62. It is to be noted that, when the frame 16 is supported by the second temporary receiving unit 62, the wafer 10 is positioned on the lower side and the adhesive tape 18 is positioned on the upper side.

It is to be noted that, in the second carry-in step described above of carrying in the frame 16 from the second temporary receiving unit 62 to the third temporary receiving unit 72, the frame 16 positioned to the second temporary receiving unit 62 and supporting thereon the wafer 10 before divided into chips may be carried into the upper stage guide rail portion 80 of the third temporary receiving unit 72 from the second temporary receiving unit 62 by the second carry-out/in unit 64, and after the frame 16 supported on the upper stage guide rail portion 80 is moved upwardly by the frame lifting unit 84 until the wafer 10 is divided into chips by the dividing unit 96, at the first carry-out step described above, the frame 16 supporting the wafer 10 divided into chips may be supported by the lower stage guide rail portion 82. Further, the frame 16 supporting a next wafer 10 (wafer 10 for which the dividing step is to be carried out next) before division into chips positioned to the second temporary receiving unit 62 may be carried into the lower stage guide rail portion 82 of the third temporary receiving unit 72 from the second temporary receiving unit 62 by the second carry-out/in unit 64, and the frame 16 that is supported on the upper stage guide rail portion 80 and supports the wafer 10 divided into chips may be carried out to the second temporary receiving unit 62 by the second carry-out/in unit 64.

More specifically, a frame 16 that supports a wafer 10 divided into chips is supported on the upper stage guide rail portion 80 while another frame 16 that supports a next wafer 10 before division positioned to the second temporary receiving unit 62 is grasped by the pair of grasping pieces 70 and is carried into the lower stage guide rail portion 82 of the third temporary receiving unit 72 positioned at a height same as that of the frame holding face 60a of the second guide rails 60 of the second temporary receiving unit 62. Then, the pair of third guide rails 74 are moved down by the guide rail lifting unit of the third temporary receiving unit 72 and the height of the upper stage guide rail portion 80 is adjusted to the height of the frame holding face 60a of the second guide rails 60 of the second temporary receiving unit 62. Then, the frame 16 that supports the wafer 10 after division supported on the lower stage guide rail portion 82 is grasped by the pair of grasping pieces 70 and carried out to the second temporary receiving unit 62 from the lower stage guide rail portion 82 of the third temporary receiving unit 72. By this, in the state in which the pair of grasping pieces 70 do not grasp a frame 16, the X axis movable member 68 of the second carry-out/in unit 64 does not move, and improvement of the productivity can be anticipated.

After the first carry-out step is performed, a second transport step of transporting a frame 16 carried out from the third temporary receiving unit 72 to the second temporary receiving unit 62 by the second carry-out/in unit 64 and having the contracted adhesive tape 18 (frame 16 that supports the wafer 10 after division) thereon to the first temporary receiving unit 36 by the second transport unit 112 is performed.

At the second transport step, the Y axis movable member 116 is first moved by the Y axis feeding unit of the second transport unit 112 to position the holding portion 120 of the second transport unit 112 above the frame 16 supported on the second temporary receiving unit 62. Then, the holding portion 120 is moved down by the Z axis feeding unit of the second transport unit 112 until the suction pads 124 are closely contacted with the frame 16 and the frame 16 is sucked to and held on the suction pads 124. Then, the holding portion 120 is moved up by the Z axis feeding unit of the second transport unit 112 to move the frame 16 sucked to and held on the suction pads 124 upwardly away from the second temporary receiving unit 62.

Then, the holding portion 120 is positioned above the first temporary receiving unit 36 by the Y axis feeding unit of the second transport unit 112. Then, the holding portion 120 is moved down by the Z axis feeding unit of the second transport unit 112 until the frame 16 sucked to and held by the suction pads 124 is brought into contact with the first temporary receiving unit 36. Then, the suction force of the suction pads 124 is cancelled such that the frame 16 is supported on the first temporary receiving unit 36. It is to be noted that, when the frame 16 is supported on the first temporary receiving unit 36, the wafer 10 divided into chips is positioned on the lower side and the adhesive tape 18 is positioned on the upper side.

In the embodiment depicted, after the second transport step is performed, a third carry-in step of carrying in the frame 16 supporting the wafer 10 transported to the first temporary receiving unit 36 to the cleaning unit 126 is performed. It is to be noted that, in the case where cleaning of a wafer 10 by the cleaning unit 126 is omitted, after the second transport step is performed, the frame 16 transported to the first temporary receiving unit 36 may be carried out into the cassette 8 by the first carry-out/in unit 26.

At the third carry-in step, the X axis movable member 30 and the Z axis movable member 32 are first moved by the X axis feeding unit and the Z axis feeding unit of the first carry-out/in unit 26 to position the pair of holding pieces 130 of the third carry-out/in unit 128 to a position at which they can hold the frame 16 transported to the first temporary receiving unit 36. Then, after the frame 16 is held by the pair of holding pieces 130, the frame 16 is moved in the X axis direction and the Z axis direction by the X axis feeding unit and the Z axis feeding unit of the first carry-out/in unit 26 until the frame 16 is carried in to the lower face of the holding portion 132 of the cleaning unit 126 from the first temporary receiving unit 36. At this time, the wafer 10 divided into chips is positioned on the lower face of the suction chuck 138 of the holding portion 132. Then, the wafer 10 is sucked to and held by the suction chuck 138 from the adhesive tape 18 side and the frame 16 is fixed to the holding plate 136 by the plurality of clamps 140. Then, the grasping of the frame 16 by the pair of holding pieces 130 is canceled and the wafer 10 and the frame 16 are held by the holding portion 132. It is to be noted that, when the wafer 10 and the frame 16 are held by the holding portion 132, the wafer 10 is positioned on the lower side and the adhesive tape 18 is positioned on the upper side.

After the third carry-in step is performed, a cleaning step of cleaning the wafer 10 divided into chips is performed.

At the cleaning step, while the holding plate 136 is rotated by the motor 134 first, cleaning water is jetted from the cleaning water jetting unit toward the wafer 10 divided into the chips. By this, the wafer 10 can be cleaned, and the cleaning water can be removed from the wafer 10 by centrifugal force by the rotation of the holding plate 136. Then, while the holding plate 136 is rotated by the motor 134, dry air is jetted from the dry air jetting unit toward the wafer 10, and by this, the cleaning water that has not been cleaned by the centrifugal force by the rotation of the holding plate 136 can be removed from the wafer 10 to dry the wafer 10. Since such a cleaning step as just described is performed in a state in which the wafer 10 is directed downwardly, dirty appearing upon the cleaning step does not remain on the chip.

After the cleaning step is performed, a second carry-out step of carrying out the frame 16 supporting the wafer 10 cleaned already from the cleaning unit 126 to the first temporary receiving unit 36 is performed.

At the second carry-out step, the X axis movable member 30 and the Z axis movable member 32 are first moved by the X axis feeding unit and the Z axis feeding unit of the first carry-out/in unit 26 to position the pair of holding pieces 130 of the third carry-out/in unit 128 to a position at which the pair of holding pieces 130 can hold the frame 16 held on the holding portion 132 of the cleaning unit 126. Then, the frame 16 is held by the pair of holding pieces 130. Then, the suction force of the suction chuck 138 of the holding portion 132 of the cleaning unit 126 is cancelled and the fixation of the frame 16 by the plurality of clamps 140 is cancelled, and the frame 16 is transferred to the third carry-out/in unit 128. Then, the X axis feeding unit and the Z axis feeding unit of the first carry-out/in unit 26 are moved in the X axis direction and the Z axis direction to carry out the frame 16 from the cleaning unit 126 to the first temporary receiving unit 36. Then, the holding of the frame 16 by the pair of holding pieces 130 is cancelled to allow the first temporary receiving unit 36 to support the frame 16. It is to be noted that, when the frame 16 is supported on the first temporary receiving unit 36, the wafer 10 is positioned on the lower side and the adhesive tape 18 is positioned on the upper side.

After the second carry-out step is performed, a second reversing step of holding the frame 16, which supports the cleaned wafer 10 carried out to the first temporary receiving unit 36 by the third carry-out/in unit 128, by the holding portion 170 of the second reversing unit 146 and rotating the rotatable shaft 168 of the X axis direction by 180 degrees to reverse the front and back of the frame 16 and then placing the frame 16 on the transparent table 144.

At the second reversing step, the second reversing unit 146 positioned below the first temporary receiving unit 36 is first moved upwardly by the lifting unit 148 until the one holding portion 174 or the other holding portion 176 is closely contacted with the frame 16, which has been carried out to the first temporary receiving unit 36 and supports the cleaned wafer 10 thereon, and the frame 16 is sucked to and held by the one holding portion 174 or the other holding portion 176. Then, the distance between the pair of first guide rails 38 is expanded to the permission position, at which passage of the frame 16 in the Z axis direction is permitted, by the guide rail opening/closing portion 40 of the first temporary receiving unit 36, and then the frame 16 is transferred from the first temporary receiving unit 36 to the second reversing unit 146. Then, the rotatable shaft 168 is rotated by 180 degrees by the motor of the second reversing unit 146 to reverse the front and back of the frame 16 sucked to and held by the one holding portion 174 or the other holding portion 176. By this, the front face 10a of the wafer 10 is directed upwardly, and the wafer 10 is positioned on the upper side and the adhesive tape 18 is positioned on the lower side. Then, the second reversing unit 146 is moved down by the lifting unit 148 until the frame 16 is brought into contact with the upper face of the transparent table 144 positioned just below the first temporary receiving unit 36. At this time, the wafer 10 divided into chips is positioned above the transparent plate 154 of the transparent table 144. Then, the suction force of the one holding portion 174 or the other holding portion 176 is cancelled to place the frame 16 on the transparent table 144. Then, suction force is generated in the frame suction holes 156 of the transparent table 144 to suck and hold the frame 16 to and by the upper face of the transparent table 144.

After the second reversing step is performed, a first table moving step of moving the transparent table 144 on which the frame 16 that is in the state in which the wafer 10 is directed upwardly by the reversal of the front and back by the second reversing unit 146 in a direction toward the second temporary receiving unit 62 from just below the first temporary receiving unit 36 by the table moving unit 150 to position the transparent table 144 below the chamber 178 but above the UV irradiation unit 188.

After the first table moving step is performed, an inert gas supplying step of covering the wafer 10 supported on the frame 16 placed on the transparent table 144 moved by the table moving unit 150 with the chamber 178 and supplying inert gas into the chamber 178 is performed.

Figure 15:
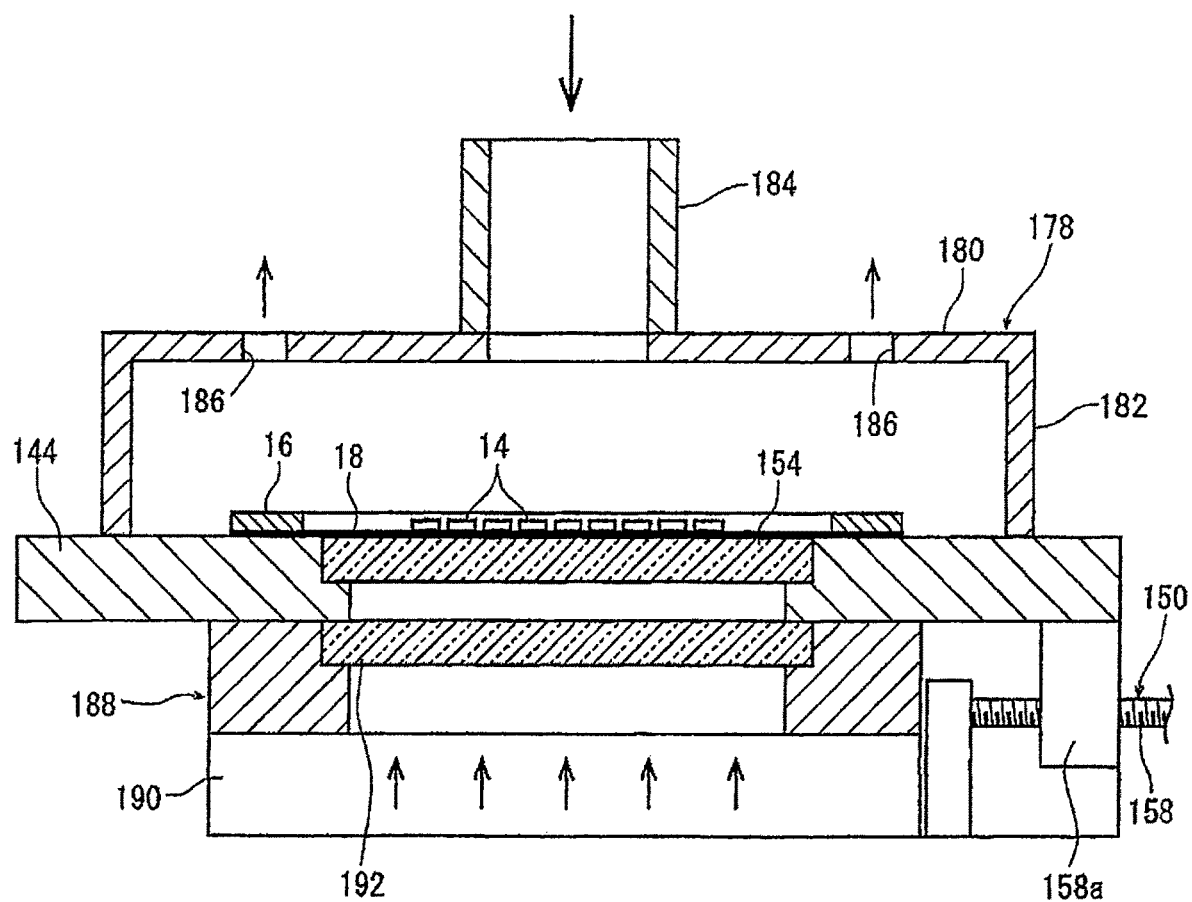
FIG. 15 is a sectional view depicting a state in which a UV irradiation step is being performed.

At the inert gas supplying step, the chamber 178 is first moved down by the chamber lifting unit until the lower end of the skirt wall 182 of the chamber 178 is brought into contact with the upper face of the transparent table 144 as depicted in FIG. 15. Consequently, the wafer 10 supported on the frame 16 placed on the transparent table 144 can be covered with the circular top wall 180 and the skirt wall 182. Then, the inert gas supplying unit is rendered operative to supply inert gas (for example, nitrogen ($N_2$) gas) into the chamber 178 while oxygen ($O_2$) in the chamber 178 is discharged from the open air holes 186.

After the inert gas supplying step is performed, a UV irradiation step of irradiating ultraviolet rays on the adhesive tape 18 stuck to the frame 16.

At the UV irradiation step, ultraviolet rays are irradiated from a UV light source of the UV irradiation unit 188 upon the adhesive tape 18 stuck to the frame 16 to decrease the adhesive force of the adhesive tape 18. By this, at a step of picking upon a chip from the adhesive tape 18, the chip can be picked up smoothly. Further, in the embodiment depicted, since inert gas is supplied into the chamber 178 to discharge oxygen from the within the chamber 178, it is suppressed that the adhesiveness of the adhesive layer becomes liable to be maintained by a reaction of the adhesive layer of the adhesive tape 18 and oxygen, and the adhesive force of the adhesive tape 18 can be reduced efficiently. Then, after the adhesive force of the adhesive tape 18 is reduced, the supply of inert gas into the chamber 178 is stopped and the chamber 178 is moved up by the chamber lifting unit.

After the UV irradiation step is performed, a second table moving step of positioning the transparent table 144, on which the frame 16 that is in a state in which ultraviolet rays are irradiated upon the adhesive tape 18 by the UV irradiation unit 188 and the wafer 10 is directed upwardly is placed, to a position just below the first temporary receiving unit 36 by the table moving unit 150 is performed.

After the second table moving step is performed, a third reversing step of holding the frame 16 placed on the transparent table 144 by the holding portion 170 of the second reversing unit 146 and rotating the rotatable shaft 168 by 180 degrees to allow the frame 16 held by the holding portion 170 to be held by the first reversing unit 42.

At the third reversing step, the second reversing unit 146 is first moved down by the lifting unit 148 until the one holding portion 174 or the other holding portion 176 of the second reversing unit 146 is brought into close contact with the frame 16 placed on the transparent table 144 and the frame 16 is sucked to and held by the one holding portion 174 or the other holding portion 176. Then, the suction force of the frame suction holes 156 of the transparent table 144 is cancelled. Then, the second reversing unit 146 is moved up by the lifting unit 148 to such a degree that the holding portion 170 of the second reversing unit 146 can rotate by 180 degrees. Then, the rotatable shaft 168 is rotated by 180 degrees by the motor of the second reversing unit 146 to reverse the front and back of the frame 16 sucked to and held by the one holding portion 174 or the other holding portion 176. By this, the front face 10a of the wafer 10 is directed downwardly, and the wafer 10 is positioned on the lower side and the adhesive tape 18 is positioned on the upper side.

Then, the first reversing unit 42 is positioned above the second reversing unit 146, by which the wafer 10 is held, by the Y axis feeding unit of the first transport unit 44 and the suction pads 58 of the first reversing unit 42 are directed downwardly. Then, the first reversing unit 42 is moved down by the Z axis feeding unit of the first transport unit 44 until the suction pads 58 of the first reversing unit 42 are closely contacted with the frame 16 held on the second reversing unit 146 and the frame 16 is sucked to and held by the suction pads 58. When the first reversing unit 42 moves down, the first guide rails 38 of the first temporary receiving unit 36 are positioned at the permission position, at which passage of the frame 16 in the Z axis direction is permitted, by the guide rail opening/closing portion 40 of the first temporary receiving unit 36, and the first reversing unit 42 passes between the first guide rails 38. Then, the suction force of the one holding portion 174 or the other holding portion 176 of the second reversing unit 146 is cancelled to allow the first reversing unit 42 to hold the frame 16.

It is to be noted that, at the third reversing step described above, when the transparent table 144 on which the frame 16 in the state in which ultraviolet rays are irradiated upon the adhesive tape 18 by the UV irradiation unit 188 and the wafer 10 is directed upwardly is positioned just below the first temporary receiving unit 36 by the table moving unit 150, a frame 16 placed on the transparent table 144 (a frame 16 by which a wafer 10 for which the UV irradiation step has been performed) may be held by the one holding portion 174 of the second reversing unit 146 while a next frame 16 by which a wafer 10 cleaned already and supported on the first temporary receiving unit 36 (a frame 16 by which a wafer 10 for which the UV irradiation step is to be performed next) is held by the other holding portion 176 of the second reversing unit 146, and the rotatable shaft 168 of the X axis direction may be rotated by 180 degrees until the frame 16 held by the one holding portion 174 is held by the first reversing unit 42 while the next frame 16 held by the other holding portion 176 is placed on the transparent table 144.

More particularly, the other holding portion 176 of the second reversing unit 146 is first directed upwardly and the second reversing unit 146 is moved up by the lifting unit 148 until the other holding portion 176 is closely contacted with a next frame 16 that supports the cleaned wafer 10 supported on the first temporary receiving unit 36 while the next frame 16 is sucked to and held by the other holding portion 176. Then, the distance between the pair of first guide rails 38 is expanded to that at the permission position, which permits passage of the frame 16 in the Z axis direction, by the guide rail opening/closing portion 40 of the first temporary receiving unit 36, and the frame 16 is transferred from the first temporary receiving unit 36 to the second reversing unit 146. Then, the second reversing unit 146 is moved down by the lifting unit 148 until the one holding portion 174 of the second reversing unit 146 is closely contacted with the frame 16 placed on the transparent table 144 and the frame 16 is sucked to and held by the one holding portion 174. Then, the second reversing unit 146 is moved up by the lifting unit 148 to such a degree that the holding portion 170 of the second reversing unit 146 can rotate by 180 degrees.

Then, the rotatable shaft 168 is rotated by 180 degrees by the motor of the second reversing unit 146 to position the frame 16 sucked to and held by the one holding portion 174 to the upper side and position the frame 16 sucked to and held by the other holding portion 176 to the lower side. Then, the second reversing unit 146 is moved down by the lifting unit 148 until the frame 16 sucked to and held by the other holding portion 176 is brought into contact with the upper face of the transparent table 144 positioned just below the first temporary receiving unit 36. Then, the suction force of the one holding portion 174 is cancelled to allow the frame 16 to be placed on the transparent table 144.

Then, the first reversing unit 42 is moved down by the Z axis feeding unit of the first transport unit 44 until the suction pads 58 of the first reversing unit 42 are closely contacted with the frame 16 sucked to and held by the one holding portion 174 of the second reversing unit 146 while the frame 16 is sucked to and held by the suction pads 58. Then, the suction force of the one holding portion 174 of the second reversing unit 146 is canceled to allow the frame 16 to be held by the first reversing unit 42. By this, the third reversing step for the frame 16 that supports the wafer 10 for which the UV irradiation step has been performed and the second reversing step for the frame 16 that supports the wafer 10 for which the UV irradiation step is to be performed next can be performed efficiently, and the improvement of the productivity can be anticipated.

After the third reversing step is performed, a fourth reversing step of rotating the frame 16 held by the first reversing unit 42 by the rotatable shaft 52 of the X axis direction by 180 degrees such that the frame 16 is supported on the first temporary receiving unit 36 is performed.

At the fourth reversing step, the rotatable shaft 52 of the first reversing unit 42 is first rotated by 180 degrees to reverse the front and back of the frame 16 sucked to and held by the suction pads 58. Consequently, the front face 10a of the wafer 10 is directed upwardly, and the wafer 10 is positioned on the upper side and the adhesive tape 18 is positioned on the lower side. Then, the first reversing unit 42 is moved up by the Z axis feeding unit of the first transport unit 44 such that it passes between the pair of first guide rails 38, which are positioned at the permission position, and positions the frame 16 held by the first reversing unit 42 above the first temporary receiving unit 36. Then, the pair of first guide rails 38 are positioned to the supporting position by the guide rail opening/closing portion 40. Then, the first reversing unit 42 is moved down by the Z axis feeding unit of the first transport unit 44 until the frame 16 held by the first reversing unit 42 is closely contacted with the pair of first guide rails 38. Then, the suction force of the suction pads 58 is cancelled to allow the frame 16 to be supported on the first temporary receiving unit 36.

After the fourth reversing step is performed, a third carry-out step of carrying out the frame 16 supported on the first temporary receiving unit 36 into the cassette 8 is performed.

At the third carry-in step, the X axis movable member 30 and the Z axis movable member 32 are first moved by the X axis feeding unit and the Z axis feeding unit of the first carry-out/in unit 26 until the pair of grasping pieces 34 are positioned to an end portion of the frame 16 supported by the first temporary receiving unit 36 (end portion in the X axis direction remote from the cassette 8). Then, after an end portion of the frame 16 is grasped by the pair of grasping pieces 34, the X axis feeding unit and the Z axis feeding unit of the first carry-out/in unit 26 are moved in the X axis direction and the Z axis direction to carry out and accommodate the frame 16 from the first temporary receiving unit 36 into the cassette 8. Then, the grasping of the frame 16 by the pair of grasping pieces 34 is cancelled to allow the frame 16 to be supported by the cassette 8. It is to be noted that, when the frame 16 is accommodated into the cassette 8, the wafer 10 is positioned on the upper side and the adhesive tape 18 is positioned on the lower side.

As above, since the wafer dividing apparatus 2 of the embodiment depicted applies external force to a wafer 10 in a state in which the wafer 10 stuck to the adhesive tape 18 is directed downwardly to divide the wafer 10 into individual chips, dust that scatters when the wafer 10 is divided into individual chips does not stick to the surface of the chips and degradation of the quality of the chips can be prevented.

It is to be noted that, in the wafer dividing apparatus 2, taking a plane that passes the second temporary receiving unit 62 and is substantially parallel to the Y axis and the Z axis as a reference, a second carry-out/in unit of a mirror structure having a configuration similar to that of the second carry-out/in unit 64, a third temporary receiving unit of a mirror structure having a configuration similar to the third temporary receiving unit 72, a frame lifting unit of a mirror structure having a configuration similar to that of the frame lifting unit 84, a dividing unit of a mirror structure having a configuration similar to that of the dividing unit 96, a suction table of a mirror structure having a configuration similar to that of the suction table 98, and a tape contraction unit of a mirror structure having a configuration similar to that of the tape contraction unit 100 may be disposed. In other words, the wafer dividing apparatus 2 may include two sets of second carry-out/in units having symmetrical structures (plane symmetrical) with respect to a plane of symmetry passing the second temporary receiving unit 62 and substantially parallel to the Y axis and the Z axis, two sets of third temporary receiving units having symmetrical structures with respect to the plane of symmetry, two sets of frame lifting units having symmetrical structures with respect to the plane of symmetry, two sets of dividing units having symmetrical structures with respect to the plane of symmetry, two sets of suction tables having symmetrical structures with respect to the plane of symmetry, and two sets of tape contraction units having symmetrical structures with respect to the plane of symmetry. By this, a second carry-in step of carrying in a frame 16 to the third temporary receiving unit of the mirror structure from the second temporary receiving unit 62, a dividing step, a suction step, a tape contraction step, and a first carry-out step of carrying out the frame 16, in which the adhesive tape 18 is contracted, from the frame lifting unit of the mirror structure to the second temporary receiving unit 62 can be performed in parallel by the two sets of the second carry-out/in units of the mirror structures, the two sets of the third temporary receiving units of the mirror structures, the two sets of frame lifting units of the mirror structures, the two sets of the dividing units of the mirror structures, the two sets of the suction tables of the mirror structures, and the two sets of tape contraction units of the mirror structures, and therefore, improvement of the productivity can be anticipated. However, the shape of the parts of the components may not be plane symmetrical with each other. In short, the mirror structure does not necessarily signify that a pair of structures are plane symmetrical with each other strictly and sometimes signifies that, for example, two structures having similar functions to each other are disposed at positions plane symmetrical with each other.

It is to be noted that, although the wafer dividing apparatus 2 of the embodiment depicted in the drawings is described in regard to an example in which it includes the first and second reversing units 42 and 146 and the first and second transport units 44 and 112, the wafer dividing apparatus 2 may not include the first reversing unit 42 nor the first transport unit 44. In other words, the first reversing step may be performed by the second reversing unit 146 and the first transport step may be performed by the second transport unit 112. In particular, when the first reversing step is to be performed, the frame 16 supported on the first temporary receiving unit 36 may be held by the holding portion 170 of the second reversing unit 146 while the rotatable shaft 168 in the X axis direction is rotated by 180 degrees to reverse the front and back of the frame 16, and when the first transport step is to be performed, the frame 16 may be received by the holding portion 120 of the second transport unit 112 from the holding portion 170 of the second reversing unit 146 and then the frame 16 held by the holding portion 120 may be transported to and supported by the second temporary receiving unit 62.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer dividing apparatus for dividing a wafer stuck to an adhesive tape and supported at an opening of a frame into individual chips along a scheduled division line, comprising:

a cassette table on which a cassette that accommodates a plurality of wafers each stuck to an adhesive tape and supported at an opening of a frame is placed and which is movable upwardly and downwardly in a Z axis direction;

a first carry-out/in unit configured to grasp the frame and move the frame in an X axis direction orthogonal to the Z axis direction to carry out the frame from the cassette placed on the cassette table or carry in the frame to the cassette;

a first temporary receiving unit including a pair of first guide rails that extend in the X axis direction and configured to support the frame carried in by the first carry-out/in unit and a guide rail opening/closing portion configured to increase a distance between the pair of first guide rails in a Y axis direction orthogonal to the Z axis direction and the X axis direction so as to permit passage of the frame in the Z axis direction;

a reversing unit including a holding portion configured to hold the frame supported on the first temporary receiving unit and configured to rotate by 180 degrees by a rotatable shaft extending in the X axis direction to reverse front and back of the frame;

a transport unit configured to move the reversed frame in the Y axis direction;

a second temporary receiving unit including a pair of second guide rails extending in the X axis direction and configured to support the frame moved in the Y axis direction;

a second carry-out/in unit configured to move the frame supported on the second temporary receiving unit in the X axis direction;

a third temporary receiving unit disposed on one side in the X axis direction of the second temporary receiving unit and including a pair of third guide rails extending in the X axis direction and configured to support the frame received by the second carry-out/in unit and a guide rail operation portion configured to expand a distance between the pair of third guide rails in the Y axis direction so as to permit passage of the frame in the Z axis direction;

a frame lifting unit disposed at a lower location in the Z axis direction of the third temporary receiving unit and configured to support and move the frame supported on the third temporary receiving unit upwardly or downwardly in the Z axis direction;

a dividing unit disposed at an upper location in the Z axis direction of the third temporary receiving unit and including a cylindrical portion configured to be brought into contact, when the frame supported on the frame lifting unit is moved up, with the adhesive tape located between the frame and the wafer to expand the adhesive tape thereby to divide the wafer into the individual chips along the scheduled division line;

a suction table disposed in an inside of the cylindrical portion and configured to suck and hold the wafer divided into the chips to maintain a distance between the chips; and a tape contraction unit disposed adjacent the frame lifting unit and configured to heat and contract the slackened adhesive tape, wherein the transport unit is configured to transport the frame, which has been carried out from the third temporary receiving unit to the second temporary receiving unit by the second carry-out/in unit and in which the adhesive tape is in the contracted state, to the first temporary receiving unit.

2. The wafer dividing apparatus according to claim 1, further comprising:

a cleaning unit disposed on an opposite side to the cassette table across the first temporary receiving unit and configured to clean the wafer supported on the frame; and a third carry-out/in unit configured to carry in the frame transported to the first temporary receiving unit to the cleaning unit or carry out the frame from the cleaning unit.

3. The wafer dividing apparatus according to claim 2, further comprising:

a transparent table disposed just below the first temporary receiving unit and including a transparent plate of a size corresponding to a size of the wafer;

a lifting unit configured to move the reversing unit between the transparent table and the first temporary receiving unit;

a table moving unit configured to move the transparent table, on which the frame whose front and back are reversed by the reversing unit and the wafer is in an upwardly directed state, from just below the first temporary receiving unit in a direction toward the second temporary receiving unit;

a chamber disposed below the second temporary receiving unit and configured to cover the wafer supported on the frame placed on the transparent table moved by the table moving unit, the chamber comprising an inert gas supplying portion configured to supply inert gas into the chamber; and an ultraviolet irradiation unit disposed below the chamber and configured to irradiate ultraviolet rays upon the adhesive tape stuck to the frame, wherein the reversing unit is disposed at an upper location of the transparent table and includes a holding portion configured to hold the frame, which has been carried out from the cleaning unit to the first temporary receiving unit by the third carry-out/in unit, the reversing unit being operable to rotate by 180 degrees to reverse the front and back of the frame and place the frame on the transparent table.

4. The wafer dividing apparatus according to claim 3, wherein the reversing unit includes a first reversing unit including a holding portion configured to hold the frame supported on the first temporary receiving unit and configured to rotate by 180 degrees by a rotatable shaft extending in the X axis direction to reverse the front and back of the frame, and a second reversing unit disposed at an upper location of the transparent table and including a holding portion configured to hold the frame, which has been carried out from the cleaning unit to the first temporary receiving unit by the third carry-out/in unit, the second reversing unit being operable to rotate by 180 degrees to reverse the front and back of the frame and place the frame on the transparent table.

5. The wafer dividing apparatus according to claim 4, wherein the transport unit includes a first transport unit configured to move the frame reversed by the first reversing unit in the Y axis direction, and a second transport unit configured to transport the frame, which has been carried out from the third temporary receiving unit to the second temporary receiving unit by the second carry-out/in unit and in which the adhesive tape is in the contracted state, to the first temporary receiving unit.

6. The wafer dividing apparatus according to claim 4, wherein the holding portion of the second reversing unit includes a first holding portion and a second holding portion; and when ultraviolet rays are irradiated upon the adhesive tape by the ultraviolet irradiation unit and the transparent table on which the frame in which the wafer is in an upwardly directed state is placed is positioned just below the first temporary receiving unit by the table moving unit, the second reversing unit holds the frame placed on the transparent table with the first holding portion and holds a next frame that supports a cleaned wafer supported on the first temporary receiving unit with the second holding portion, and rotates by 180 degrees to allow the frame held by the first holding portion to be held by the first reversing unit and place the next frame held by the second holding portion on the transparent table, the first reversing unit rotates by 180 degrees by the rotatable shaft extending in the X axis direction to cause the frame held thereby to be supported by the first temporary receiving unit, and the first carry-out/in unit carries out the frame supported on the first temporary receiving unit to the cassette.

7. The wafer dividing apparatus according to claim 1, wherein the pair of third guide rails of the third temporary receiving unit include an upper stage guide rail portion at an upper location in the Z axis direction and a lower stage guide rail portion at a lower location in the Z axis direction;

the frame on which a wafer positioned to the second temporary receiving unit before being divided into chips is supported is carried in from the second temporary receiving unit to the upper stage guide rail portion of the third temporary receiving unit by the second carry-out/in unit;

the frame on which the wafer divided into chips is supported is supported on the lower stage guide rail portion after the frame supported on the upper stage guide rail portion is moved up by the frame lifting unit and the wafer is divided into chips by the dividing unit;

the frame that is positioned to the second temporary receiving unit and on which a next wafer before being divided into chips is supported is carried in from the second temporary receiving unit to the upper stage guide rail portion of the third temporary receiving unit by the second carry-out/in unit; and the frame that is supported on the lower stage guide rail portion and supports the wafer divided into chips is carried out to the second temporary receiving unit by the second carry-out/in unit.

8. The wafer dividing apparatus according to claim 1, further comprising:

a second second carry-out/in unit;
a second third temporary receiving unit;
a second frame lifting unit;
a second dividing unit;
a second suction tablet; and
a second tape contraction unit.

* * * * *